United States Patent
Yamazaki et al.

(10) Patent No.: US 8,054,690 B2
(45) Date of Patent: Nov. 8, 2011

(54) NON-VOLATILE MEMORY AND SEMICONDUCTOR DEVICE

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/814,761

(22) Filed: Jun. 14, 2010

(65) Prior Publication Data

US 2010/0296343 A1    Nov. 25, 2010

Related U.S. Application Data

(60) Continuation of application No. 12/407,539, filed on Mar. 19, 2009, now Pat. No. 7,855,919, which is a division of application No. 11/924,090, filed on Oct. 25, 2007, now Pat. No. 7,512,006, which is a division of application No. 11/109,325, filed on Apr. 19, 2005, now Pat. No. 7,298,652, which is a continuation of application No. 10/383,209, filed on Mar. 6, 2003, now Pat. No. 6,914,818, which is a division of application No. 09/976,770, filed on Oct. 12, 2001, now Pat. No. 6,556,475.

(30) Foreign Application Priority Data

Oct. 13, 2000    (JP) .................................. 2000-314369

(51) Int. Cl.
    *G11C 16/04* (2006.01)
(52) U.S. Cl. ......... 365/185.18; 365/185.24; 365/185.25; 365/185.03; 365/185.23; 365/185.26
(58) Field of Classification Search ............. 365/185.18, 365/185.23, 185.24, 185.25, 185.26, 185.03
See application file for complete search history.

(56) References Cited

U.S. PATENT DOCUMENTS

| | | | |
|---|---|---|---|
| 4,999,525 A | | 3/1991 | Park et al. |
| 5,050,124 A | | 9/1991 | Saeki et al. |
| 5,130,777 A | | 7/1992 | Galbraith et al. |
| 5,231,315 A | | 7/1993 | Thelen, Jr. |
| 5,289,401 A | | 2/1994 | Shima |
| 5,452,249 A | * | 9/1995 | Miyamoto et al. ........ 365/185.13 |
| 5,488,415 A | | 1/1996 | Uno |
| 5,495,453 A | | 2/1996 | Wojciechowski et al. |
| 5,587,668 A | * | 12/1996 | Shibata et al. .................. 326/36 |

(Continued)

FOREIGN PATENT DOCUMENTS

EP    0 833 348 A1    4/1998

(Continued)

*Primary Examiner* — Viet Nguyen
(74) *Attorney, Agent, or Firm* — Husch Blackwell LLP

(57) ABSTRACT

There is provided a non-volatile memory which enables high accuracy threshold control in a writing operation. In the present invention, a drain voltage and a drain current of a memory transistor are controlled to carry out a writing operation of a hot electron injection system, which is wherein a charge injection speed does not depend on a threshold voltage. FIGS. 1A and 1B are views of a circuit structure for controlling the writing. In FIGS. 1A and 1B, an output of an operational amplifier 103 is connected to a control gate of a memory transistor 101, a constant current source 102 is connected to a drain electrode, and a source electrode is grounded. The constant current source 102 and a voltage Vpgm are respectively connected to two input terminals of the operational amplifier 103.

7 Claims, 26 Drawing Sheets

U.S. PATENT DOCUMENTS

| | | | |
|---|---|---|---|
| 5,592,409 A * | 1/1997 | Nishimura et al. | 365/145 |
| 5,706,240 A | 1/1998 | Fiocchi et al. | |
| 5,721,705 A | 2/1998 | Hong et al. | |
| 5,748,534 A | 5/1998 | Dunlap et al. | |
| 5,761,125 A | 6/1998 | Himeno | |
| 5,828,604 A | 10/1998 | Kawai et al. | |
| 5,880,993 A | 3/1999 | Kramer et al. | |
| 5,933,373 A | 8/1999 | Takahashi | |
| 5,973,960 A | 10/1999 | Shibata et al. | |
| 6,016,272 A * | 1/2000 | Gerna et al. | 365/185.21 |
| 6,084,799 A | 7/2000 | Tanzawa et al. | |
| 6,108,241 A | 8/2000 | Chevallier | |
| 6,111,791 A | 8/2000 | Ghilardelli | |
| 6,122,190 A * | 9/2000 | Ooishi | 365/149 |
| 6,131,073 A | 10/2000 | Honda et al. | |
| 6,172,908 B1 | 1/2001 | Cappelletti et al. | |
| 6,194,967 B1 | 2/2001 | Johnson et al. | |
| 6,222,762 B1 | 4/2001 | Guterman et al. | |
| 6,246,608 B1 | 6/2001 | Odani | |
| 6,317,364 B1 | 11/2001 | Guterman et al. | |
| 6,411,549 B1 | 6/2002 | Pathak et al. | |
| 6,434,051 B1 | 8/2002 | Endo | |
| 6,452,437 B1 | 9/2002 | Takeuchi et al. | |
| 6,456,557 B1 | 9/2002 | Dadashev et al. | |
| 6,466,481 B1 * | 10/2002 | Pasotti et al. | 365/185.21 |
| 6,556,475 B2 * | 4/2003 | Yamazaki et al. | 365/185.03 |
| 6,600,692 B2 * | 7/2003 | Tanzawa | 365/226 |
| 6,625,057 B2 | 9/2003 | Iwata | |
| 6,639,837 B2 | 10/2003 | Takano et al. | |
| 6,856,546 B2 | 2/2005 | Guterman et al. | |
| 6,914,818 B2 * | 7/2005 | Yamazaki et al. | 365/185.18 |
| 7,298,652 B2 * | 11/2007 | Yamazaki et al. | 365/185.18 |
| 7,324,380 B2 | 1/2008 | Negut et al. | |
| 7,428,172 B2 * | 9/2008 | Choy et al. | 365/185.22 |
| 7,512,006 B2 * | 3/2009 | Yamazaki et al. | 365/185.18 |
| 7,855,919 B2 * | 12/2010 | Yamazaki et al. | 365/185.18 |
| 2002/0039313 A1 | 4/2002 | Kuriyama | |
| 2003/0016566 A1 | 1/2003 | Yamaki et al. | |

FOREIGN PATENT DOCUMENTS

| | | |
|---|---|---|
| EP | 0 908 895 A1 | 4/1999 |
| JP | 49-22356 | 6/1974 |
| JP | 10-199300 | 7/1998 |
| JP | 11-191296 | 7/1999 |
| JP | 2001-15716 | 1/2001 |
| JP | 2002-124091 | 4/2002 |

* cited by examiner

NON-VOLATILE MEMORY AND SEMICONDUCTOR DEVICE

This application is a continuation of U.S. application Ser. No. 12/407,539 filed on Mar. 19, 2009 now U.S. Pat. No. 7,855,919 which is a divisional of U.S. application Ser. No. 11/924,090 filed on Oct. 25, 2007 (now U.S. Pat. No. 7,512,006) which is a divisional of U.S. application Ser. No. 11/109,325 filed on Apr. 19, 2005 (now U.S. Pat. No. 7,298,652 issued Nov. 20, 2007) which is a continuation of U.S. application Ser. No. 10/383,209, filed on Mar. 6, 2003 (now U.S. Pat. No. 6,914,818 issued Jul. 5, 2005) which is a divisional of U.S. application Ser. No. 09/976,770 filed on Oct. 12, 2001 (now U.S. Pat. No. 6,556,475 issued Apr. 22, 2003).

BACKGROUND OF THE INVENTION

1. Field of the Invention

The present invention relates to a semiconductor non-volatile memory, and particularly to an electrically writable and erasable semiconductor non-volatile memory (also called an EEPROM or Electrically Erasable and Programmable Read Only Memory). The present invention is particularly effective for a semiconductor non-volatile memory using a multi-value technique. Besides, the present invention relates to a semiconductor device including the semiconductor non-volatile memory.

2. Description of the Related Art

In the present specification, an electrically writable and erasable semiconductor non-volatile memory (EEPROM) indicates all semiconductor non-volatile memories in which electrical writing and electrical erasing are literally enabled, and includes, for example, a full function EEPROM and a flash memory in its category. Unless otherwise specified, the non-volatile memory and the semiconductor non-volatile memory are used to mean the EEPROM. Besides, the semiconductor device indicates all devices functioning by using semiconductor characteristics, and includes, for example, a microprocessor, an electro-optic device typified by a liquid crystal display device and an EL display device, and an electronic equipment incorporating a microprocessor or an electro-optic device in its category.

In recent years, an electrically writable and erasable semiconductor non-volatile memory (EEPROM), especially a flash memory has attracted attention as a promising candidate of a memory substituting for a magnetic disk or a DRAM. Above all, a so-called multi-value non-volatile memory each memory element of which stores data of three or higher values has attracted attention as a large capacity memory.

The non-volatile memory is divided into types, such as a NOR type, a NAND type, an AND type or a DINOR type, based on differences in their circuit structures and operation methods. As a memory element constituting the non-volatile memory, there is known a memory transistor including a floating gate, a memory transistor including a cluster layer, a memory transistor having MNOS (Metal-Nitride-Oxide-Semiconductor) structure or MONOS (Metal-Oxide-Nitride-Oxide-Semiconductor) structure, or the like.

In a conventional non-volatile memory, a hot electron injection method (called an HE injection system) and a charge injection method by FN tunnel current (called an FN current system) can be cited as a typical writing operation. In the HE injection system, a high control gate voltage and a high drain voltage are applied to a memory transistor to cause impact ionization, and a generated hot electron is drawn into a gate electrode side, so that an electric charge is injected into the memory transistor. On the other hand, in the FN current system, a high voltage is applied between a control gate electrode and a substrate to cause an FN tunnel current to flow, so that an electric charge is injected into a memory transistor.

In either case, in order to confirm that a threshold voltage after writing is within a predetermined range, verify writing is normally carried out. Especially, in a multi-value non-volatile memory, since it is necessary to control the threshold voltage after writing with high accuracy, the verify writing is indispensable. The verify writing is a method in which a small amount of charge injection and readout for confirming the threshold voltage are alternately carried out. This operation is repeated until the threshold voltage after writing falls within a predetermined range.

In the foregoing method of charge injection, there has been a problem that it is difficult to control the amount of charge injection with accuracy. This is because even in the case where the same operation voltage is applied to the memory transistor, if the charge storage amount of the memory transistor, that is, the threshold voltage is different, the charge injection speed is different.

Thus, naturally in memory transistors having different threshold voltages, even in the same memory transistor, the charge injection speed is changed as time elapses. For example, in the case where an electron is injected, a threshold voltage is increased, and an effective gate voltage seen from a channel region is decreased, so that the charge injection speed is decreased.

Further, if the charge injection speed fluctuates by a factor such as fluctuation in film quality of a tunnel oxide film, even if threshold voltages of memory transistors before writing are equal to each other, a difference gradually occurs in the charge storage amount. Then, a vicious circle occurs in which when a difference occurs in the threshold voltage, a charge injection amount further fluctuates.

The verify writing is one of methods for solving such problems. In the verify writing, since confirmation of the threshold voltage is carried out each time a small amount of charge is injected, it is not necessary to control the charge injection amount with high accuracy. However, in the verify writing, the operation of charge injection is divided into parts, and a readout operation is carried out between them, so that there is a problem that it essentially takes a period of time.

Incidentally, also in the verify writing, it is important to control the charge injection amount with accuracy. By controlling the charge injection amount with high accuracy, the number of times of division of the charge injection operation can be decreased, and so a verify writing time period can be shortened.

SUMMARY OF THE INVENTION

The present invention has been made in view of the above problems. An object of the present invention is to provide a non-volatile memory for carrying out a writing operation in which a charge injection amount can be controlled with high accuracy. Another object of the invention is to provide a non-volatile memory which realizes shortening of a verify writing time, and further, realizes substantial shortening of a writing time by a writing system without using a verify system. A still another object of the invention is to provide a semiconductor device including such a non-volatile memory.

As already described, in the conventional writing method, the charge injection speed depends on the charge storage amount of the memory transistor, and accordingly, depends on the threshold voltage. As a result, naturally in memory transistors of different states, even in the same memory transistor, the charge injection speed is changed as time elapses, and control of the charge injection amount has been difficult.

On the contrary, this means that in order to control the charge injection amount with high accuracy, a writing method is effective which has a charge injection speed independent on the charge storage amount of a memory transistor, that is, the threshold voltage. The inventor of the present invention has considered that the charge injection speed depends on the threshold voltage of the memory transistor since a control gate voltage of the memory transistor is directly controlled at the time of writing, and has devised, as a new writing method, a method of controlling a drain voltage and a drain current of the memory transistor.

That is, a non-volatile memory of the present invention is characterized in that a writing operation of a hot electron injection system is carried out by controlling a drain voltage and a drain current of a memory transistor. This writing method is characterized in that a control gate voltage is not directly controlled, but the control gate voltage is indirectly controlled so that the drain current becomes constant, and is characterized in that a charge injection speed does not depend on a threshold voltage.

In order to understand a writing operation in a non-volatile memory of the present invention, a simple circuit for carrying out writing into one memory element is cited as an example, and its operation method will be described. FIGS. 1A and 1B are used for the description.

As a memory element, various elements as shown in FIGS. 26A to 26D can be used (see embodiment 3 for more details). FIG. 26A shows a memory transistor in which a first insulating film 2602, a cluster layer 2603 constituted by semiconductor or conductor clusters 2604, a second insulating film 2605, and a control gate electrode 2606 are successively stacked on an active region 2601, and which is hereinafter referred to as a memory transistor having a cluster layer. FIG. 26D shows a memory transistor in which a first insulating film 2617, a floating gate electrode 2618 constituted by a semiconductor film or a conductive film, a second insulating film 2619, and a control gate electrode 2620 are successively stacked on an active region 2616, and which is hereinafter referred to as a memory transistor having a floating gate. FIGS. 26B and 26C show a memory transistor of MNOS structure and a memory transistor of MONOS structure, respectively.

Here, FIG. 1A shows an example of a circuit diagram using, as a memory element, the memory transistor having the cluster layer, the memory transistor of the MNOS structure, or the memory transistor of the MONOS structure, and FIG. 1B shows an example of a circuit diagram using the memory transistor having the floating gate. As symbolized by symbols of the respective memory elements, the memory transistor shown in FIG. 1A is characterized in that a region for storing an electric charge is spatially discrete, and the memory transistor shown in FIG. 1B is characterized in that a region for storing an electric charge is continuous. In both cases, the operation methods are quite identical to each other, and here, the description will be given with reference to FIG. 1A as an example.

The circuit diagram shown in FIG. 1A is composed of a memory transistor 101(a), a constant current source 102 for supplying an amount of current I, and an operational amplifier 103. The output of the operational amplifier 103 is connected to a control gate electrode of the memory transistor 101(a), the constant current source 102 is connected to a drain electrode, and a source electrode is grounded. The constant current source 102 and a voltage Vpgm are respectively connected to two input terminals of the operational amplifier 103.

The circuit shown in FIGS. 1A and 1B have negative feedback characteristics, and an operation is carried out in a state where two potentials inputted to the operational amplifier 103 are always equal to each other. As a result, in the circuit diagram shown in FIG. 1A, the memory transistor 101(a) operates in a state where a drain voltage is equal to Vpgm and a drain current is equal to I.

Actually, in the case where the drain voltage of the memory transistor 101(a) is higher than Vpgm, a positive current is outputted from the operational amplifier 103, and the control gate voltage of the memory transistor 101(a) is raised. As a result, the conductance of the memory transistor 101(a) is increased, and the drain voltage is lowered. To the contrary, in the case where the drain voltage of the memory transistor 101(a) is lower than Vpgm, a negative current is outputted from the operational amplifier 103, and the control gate voltage of the memory transistor 101(a) is lowered. As a result, it is understood that the conductance of the memory transistor 101(a) is decreased, and the drain voltage is raised.

In the present invention, as described above, the drain voltage and the drain current of the memory transistor are controlled, so that the writing operation of the HE injection system is carried out. Incidentally, Vpgm is called a writing voltage, and I is called a writing current.

When the foregoing writing method is used, and the drain voltage and the drain current are made constant, a channel region of the memory transistor has the same state independently of a charge storage amount of a floating gate. That is, the control gate voltage is shifted by the same amount as a shift of a threshold voltage, and an effective gate voltage seen from the channel region is brought into a state where it is always kept constant. Further, if the drain voltage and the drain current are constant, a certain amount of hot electron is generated, so that a charge injection speed to the floating gate becomes constant.

This means that in the case where the writing voltage Vpgm and the writing current I are constant, a relation between a shift $\Delta$Vth of the threshold voltage of the memory transistor and a writing time tw is expressed by a straight line as shown by a 201 of FIG. 2. As a result, in the non-volatile memory of the present invention, by controlling the writing time, it becomes possible to control the threshold voltage with high accuracy.

Incidentally, FIG. 2 also shows a relation between a shift of a threshold voltage in a conventional writing method and a writing time (curve 202 of FIG. 2). In the conventional writing method, in the case where the control gate voltage is made constant, since an effective gate voltage seen from the channel region is decreased as time elapses, a shift amount of threshold voltage is decreased. Thus, it is understood that it is difficult to control the shift of the threshold voltage with high accuracy by controlling the writing time.

In the present invention, the charge injection speed at the time of writing can be optimized by setting the drain voltage and the drain current of the memory transistor to suitable values. Since the writing method of the present invention is the hot electron injection, the drain voltage is required to have such a magnitude as to generate a hot electron. On the other hand, if plenty of hot electrons are generated, since the controllability of charge injection amount is lowered, it is not preferable that the drain voltage is excessively large. It is preferable that the drain voltage of the memory transistor is 3 V or higher though it depends on the size of the memory transistor, and operates in a saturation region relatively close to a linear region. Further, the writing speed is raised by setting the writing voltage Vpgm and the writing current I to large values in such a region, and on the other hand, it becomes possible to suppress consumed current by setting them to small values. With respect to the writing voltage Vpgm and the writing current I, the optimum operation points may be set according to the use of the non-volatile memory.

Besides, since the foregoing writing method is the method of hot electron injection, an electron having energy much higher than an energy barrier due to a tunnel oxide film is mainly concerned. Thus, fluctuation in film quality of the tunnel oxide film hardly influences the injection amount of hot electron, and as compared with the method of charge injection by the FN tunnel current, threshold control having little fluctuation becomes possible.

The non-volatile memory of the present invention uses the foregoing writing operation, so that substantial shortening of a writing time as will be set forth below becomes possible.

First, reference is made to FIG. 3. FIG. 3 qualitatively shows threshold distributions after the conventional writing and the writing of the present invention are carried out without a verify operation, to a memory transistor with the uniform threshold voltages. A distribution 302 expresses a distribution of threshold voltage after the conventional writing, and a distribution 301 expresses a distribution of threshold voltage after the writing of the present invention. Reference character Vtar designates a set threshold voltage after writing. In FIG. 3, when the distribution 302 after the writing of the present invention is compared with the distribution 301 after the conventional writing, both a difference between the center of the distribution and Vtar, and a distribution width are small ($\Delta V < \Delta V'$ and $\delta v < \delta v'$).

In general, in the case where a difference between threshold voltages expressing different states is small as compared with a distribution width after writing and a distance between centers, since it is impossible to bring all memory cells into the predetermined state by one writing operation, verify writing becomes necessary. On the contrary, in the case where a difference between threshold voltages is larger than a distribution width after writing and a difference between centers, it is possible to carry out writing by one writing operation. Incidentally, the verify writing is a method in which writing is not carried out at one time, but a small amount of writing and readout for confirming a threshold are alternately carried out. This operation is repeated until a threshold reaches a predetermined value.

In the conventional writing method, since the distribution width $\delta v'$ after the writing and the difference $\Delta V'$ between the centers are large as shown in FIG. 3, the method of verify writing is normally used.

In the case where the writing method of the present invention is used, as shown in FIG. 3, since the distribution width $\delta v$ after the writing and the difference $\Delta V$ between the centers are small, even in such a difference between threshold voltages that a verify operation is required in the conventional method, it becomes possible to carry out a writing operation in which a verify operation is not carried out. Specifically, in the case where the difference between threshold voltages of different states is larger than the distribution width $\delta v$ and the difference $\Delta V$ between the centers after the writing of the present invention, the writing operation in which the verify operation is not carried out becomes possible.

Besides, like a multi-value non-volatile memory, in the case where the difference between threshold voltages expressing different states is small, even in the case where the writing method according to the present invention is used, the verify writing becomes necessary. In this case, it is appropriate that the writing operation is constituted by a first writing operation in which the verify operation is not carried out and a second writing operation in which the verify operation is carried out. Specifically, writing into a state slightly lower (approximately 8v or $\Delta V$) than a final threshold voltage is carried out by the first writing operation, and a verify writing operation is carried out for a remaining shortage (approximately $\delta v$ or $\Delta V$) of the threshold voltage. Since the amount of writing by the second writing operation is very small, the number of verify times can be greatly decreased as compared with the conventional verify writing.

Thus, in the case where the writing method of the present invention is used, naturally in the writing operation in which the verify operation is not carried out, also in the writing operation in which the verify operation is carried out, the number of verify times can be decreased, and it becomes possible to greatly shorten the writing time.

Besides, in the conventional writing method, as shown in FIG. 2, when the threshold voltage is increased, the charge injection speed is lowered, and the writing operation becomes slow. On the other hand, in the writing method of the present invention, even in a high threshold voltage, the charge injection speed is constant, and the high speed writing operation becomes possible.

The structure of the present invention will be set forth below.

According to the present invention, there is provided an electrically writable and erasable non-volatile memory constituted by a memory element including a charge storage region between an active region and a control gate electrode, characterized in that an amount of charge injection into the charge storage region is controlled by controlling an amount of current flowing through the memory element and a drain voltage of the memory element.

Further, according to the present invention, there is provided an electrically writable and erasable non-volatile memory constituted by a memory element including a charge storage region between an active region and a control gate electrode, characterized in that charge injection into the charge storage region is carried out by bringing an amount of current flowing through the memory element and a drain voltage of the memory element into a constant state, and an amount of charge injection into the charge storage region is controlled by controlling a period of time for a current flows to the memory element.

Further, according to the present invention, there is provided an electrically writable and erasable non-volatile memory including at least a memory cell array in which a plurality of memory cells are arranged in a matrix form and a writing circuit, characterized in that each of the plurality of memory cells includes a memory element and a selection transistor, the memory element includes a charge storage region between an active region and a control gate electrode, and the writing circuit carries out a writing operation by controlling an amount of current flowing through the memory element and a drain voltage of the memory element.

Further, according to the present invention, there is provided an electrically writable and erasable non-volatile memory including at least a memory cell array in which a plurality of memory cells are arranged in a matrix form and a writing circuit, characterized in that each of the plurality of memory cells includes a memory element and a selection transistor, the memory element includes a charge storage region between an active region and a control gate electrode, the writing circuit has a function to hold an amount of current flowing through the memory element and a drain voltage of the memory element constant, and the writing circuit carries out a writing operation by controlling a period of time for the amount of the current flowing through the memory element and the drain voltage of the memory element are held constant.

Further, according to the present invention, there is provided an electrically writable and erasable non-volatile memory including at least a memory cell array in which a plurality of memory cells are arranged in a matrix form and a writing circuit, characterized in that each of the plurality of memory cells includes a memory element and a selection transistor, the memory element includes a charge storage region between an active region and a control gate electrode, the memory element stores states of k values not less than two values by an erase state having a threshold voltage $Vth0$, and states having (k−1) different threshold voltages $Vth1$, $Vth2$, . . . , $Vth(k-1)$ higher than the threshold voltage $Vth0$, the writing circuit has a function to hold an amount of current flowing through the memory element and a drain voltage of the memory element constant, the writing circuit carries out a writing operation by controlling a writing time in which the amount of the current flowing through the memory element and the drain voltage of the memory element are held constant; and ratios between writing times $tw1$, $tw2$, . . . , $tw(k-1)$ for writing from the erase state to the states having the threshold voltages $Vth1$, $Vth2$, . . . , $Vth(k-1)$ are $tw1:tw2: \ldots :tw(k-1)=(Vth1-Vth0):(Vth2-Vth0): \ldots :(Vth(k-1)-Vth0)$.

Further, the memory element may store multi-value data.

Further, the non-volatile memory may carry out a readout operation by reading a gate voltage of the memory element.

Further, in a writing operation of the non-volatile memory, a verify operation may not be carried out.

Further, the writing operation of the non-volatile memory includes a first writing operation and a second writing operation, and a verify operation is not carried out in the first writing operation while a verify operation may be carried out in the second writing operation.

Further, the memory element constituting the non-volatile memory may be a memory transistor in which a first insulating film, a floating gate electrode constituted by a semiconductor film or a conductive film, a second insulating film, and a control gate electrode are successively stacked on the active region.

The memory element constituting the non-volatile memory may be a memory transistor in which a first insulating film, a cluster layer which includes clusters made of semiconductor or conductor as charge-trapped centers, a second insulating film, and a control gate electrode are successively stacked on the active region.

The memory element constituting the non-volatile memory may be a memory transistor of MNOS structure or MONOS structure.

Further, there is provided a semiconductor device characterized in that the non-volatile memory is used as a recording medium.

Further, there is provided a microprocessor as the semiconductor device.

Further, there is provided a display, a video camera, a goggle display, a DVD player, a head mount display, a personal computer, a portable telephone, or a car audio, as the semiconductor device.

DETAILED DESCRIPTION OF THE PREFERRED EMBODIMENTS

The mode for carrying out the invention will next be described.

In this embodiment mode, a description will be given of a circuit structure of a non-volatile memory for carrying out the foregoing writing operation and an operation method. Incidentally, here, for simplification, although the description is given of the case of a two-value non-volatile memory and a writing method in which a verify operation is not carried out, it is easy to apply this embodiment mode to a multi-value non-volatile memory and a case where the verify writing is carried out.

Figure 4:
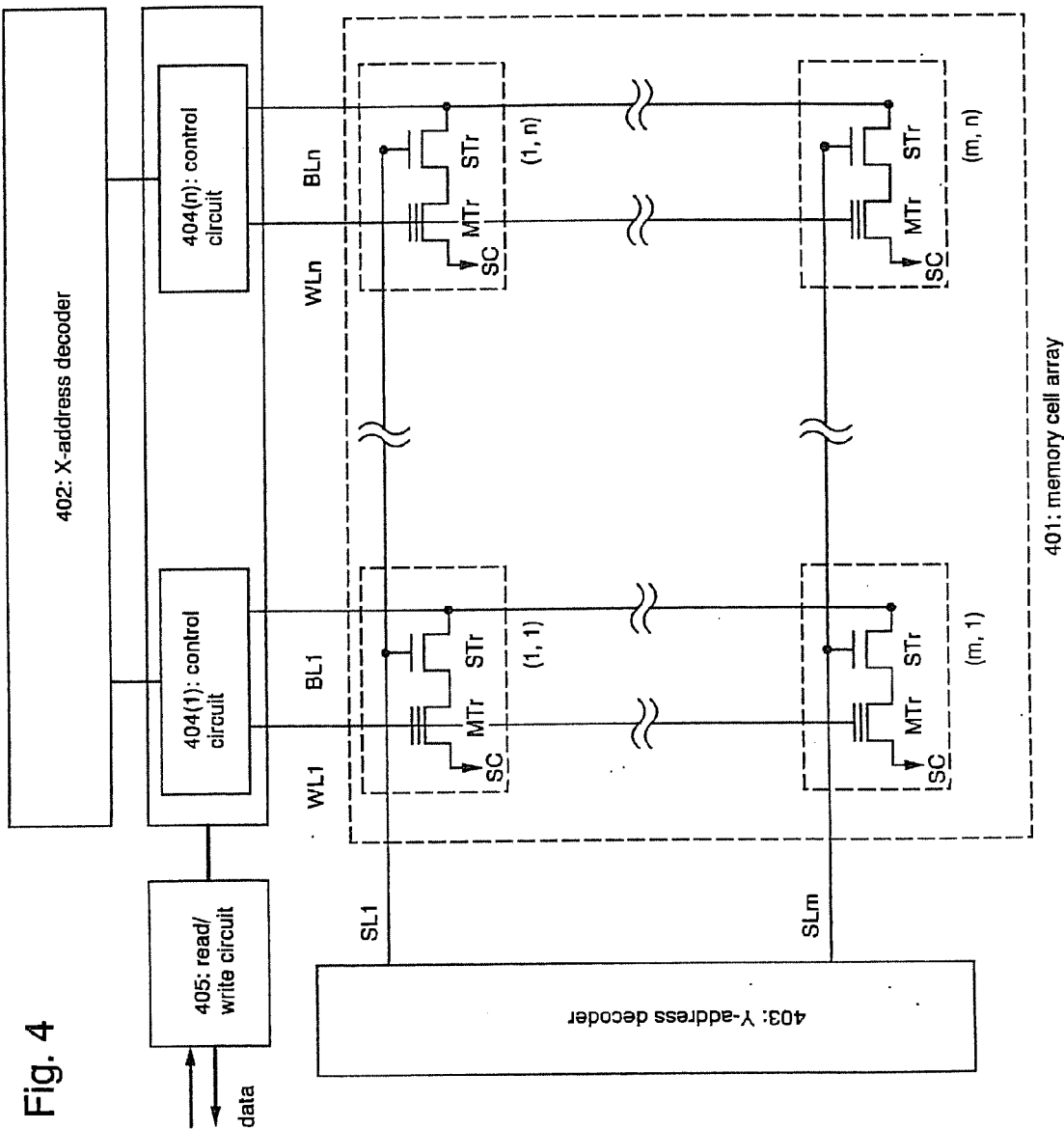
FIG. 4 is a view showing the whole structure of the non-volatile memory of the present invention.

FIG. 4 shows an example of a circuit diagram of a non-volatile memory of the present invention including a memory cell array of m rows and n columns (m and n are respectively integers equal to or larger than 1). The non-volatile memory shown in FIG. 4 is constituted by a memory cell array 401, an X-address decoder 402, a Y-address decoder 403, control circuits 404(1) to 404(n), a read/write circuit 405, and other peripheral circuits (not shown). The other peripheral circuits include an address buffer circuit, a power generation circuit, a booster circuit, a power control circuit, other control circuits and the like, and are provided as the need arises.

Incidentally, in the present specification, although a writing circuit indicates the whole circuit concerned with a writing operation, there is also a case where only a part thereof that is concerned with the writing operation is picked out and is called the writing circuit. For example, in the circuit diagram of the non-volatile memory shown in FIG. 4, although the writing circuit indicates the whole circuit concerned with the writing operation including the write/read circuit 405 and the control circuits 404, there is also a case where the writing circuit indicates only the write/read circuit 405 as a part thereof. Besides, the same is true of the readout circuit, and although the readout circuit indicates the whole circuit concerned with a readout operation, there is also a case where only a part thereof is picked out and is called the readout circuit. In the case where it is not clear which one the word exactly indicates, it is assumed that the word indicates the whole of the writing circuit and the readout circuit concerned with the whole operation.

In the non-volatile memory of this embodiment mode, each memory cell is constituted by a memory transistor MTr and a selection transistor STr. The memory transistor MTr is a memory transistor including a floating gate, and the selection transistor STr is a normal transistor. As the memory transistor MTr, it is also possible to use a memory element in which a charge storage region is spatially discrete, such as a memory transistor including a cluster layer, or a memory transistor of MNOS structure or MONOS structure (see embodiment 3). In the case where each memory cell stores one-bit data, the non-volatile memory of this embodiment mode has memory capacity of m×n bits.

In FIG. 4, a memory cell (i,j) (1≦i ≦m, 1≦j≦n) is connected to a selection line SLi, a word line WLj, a bit line BLj, and a common source line SC. Specifically, the word line WLj is connected to a control gate electrode of the memory transistor MTr, and the common source line SC is connected to a source electrode thereof. Besides, the selection line SLi is connected to a gate electrode of the selection transistor STr, and the bit line BLi is connected to a drain electrode thereof. The memory transistor MTr and the selection transistor STr constituting the memory cell (i, j) are connected in series with each other. The selection lines SL1 to SLm are connected to the Y-address decoder 403, and the word line WLj and the bit line BLj are connected to the control circuit 404(j) (1≦j≦n). The control circuits 404(1) to 404(n) are connected to the X-address decoder 402 and the read/write circuit 405.

Figure 5:
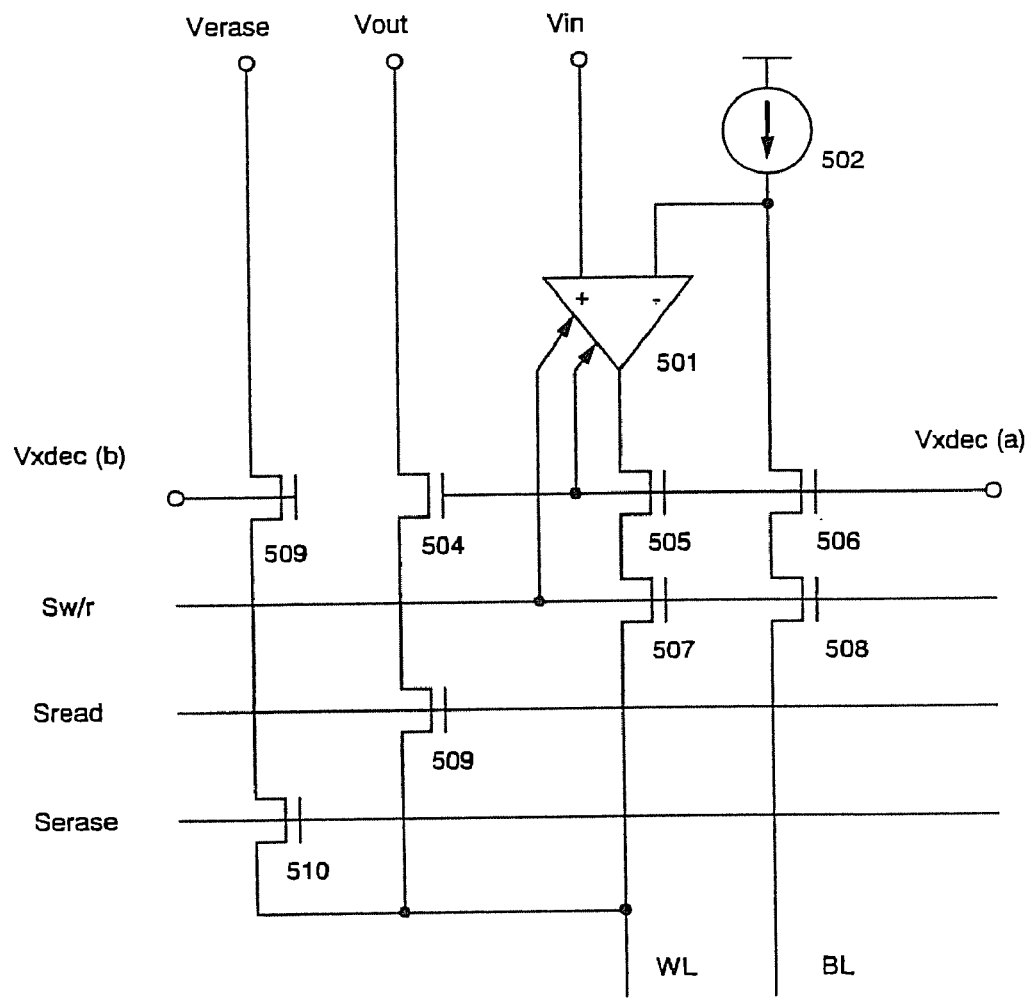
FIG. 5 is a view showing the partial structure of the non-volatile memory of the present invention.

Next, the control circuits 404(1) to 404(n) will be described. Since all the n control circuits are equal to one another, hereinafter, one of them is exemplified as a control circuit 404. FIG. 5 shows an example of a circuit diagram of the control circuit 404, and the control circuit 404 is constituted by an operational amplifier 501, a constant current source 502, and a plurality of switch transistors 503 to 510. One of inputs of the operational amplifier 501 is connected to a voltage Vin, and the other is connected to the bit line BL through the constant current source 502 and the switch transistors 506 and 508. Besides, the word line WL is connected to the output of the operational amplifier 501 through the switch transistors 505 and 507, is connected to an erase voltage Verase through the switch transistors 503 and 510, and is connected to a readout voltage Vout through the switch transistors 504 and 509.

The switch transistors 503 and 504 to 506 are respectively connected to output signals Vxdec(b) and Vxdec(a) of the X-address decoder, the switch transistors 507 and 508 are connected to a write/read signal Sw/r, the switch transistor 509 is connected to a readout signal Sread, and the switch transistor 510 is connected to an erase signal Serase. Further, the output signal Vxdec(a) of the X-address decoder and the write/read signal Sw/r are connected to the operational amplifier 501.

Figure 6A:
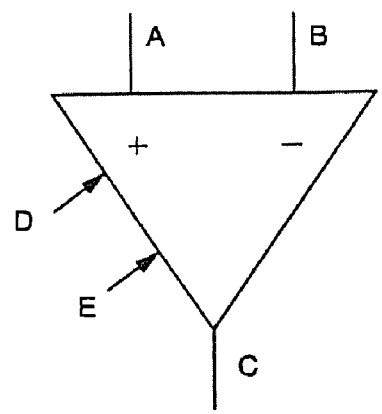
FIGS. 6A to 6C are views showing the partial structure of the non-volatile memory of the present invention.
Figure 6B:
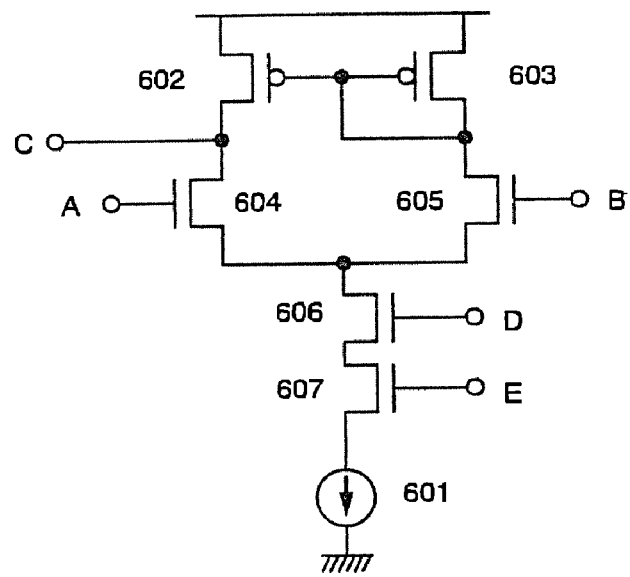
Figure 6C:
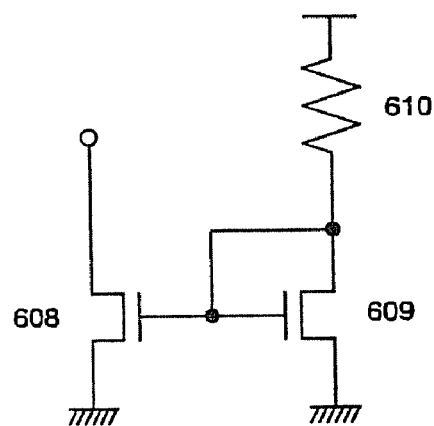
Figure 7:
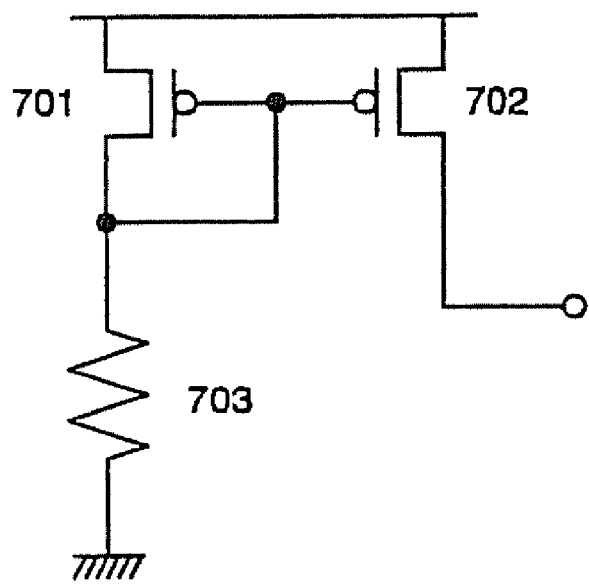
FIG. 7 is a view showing the partial structure of the non-volatile memory of the present invention.

As the operational amplifier 501 and the constant current source 502, for example, circuit diagrams shown in FIGS. 6A to 6C and FIG. 7 can be used. FIG. 6A shows a symbol of the operational amplifier 501, and terminals A, B, C, D and E are defined. FIG. 6B is a circuit diagram of the operational amplifier 501. The operational amplifier 501 is a differential amplification circuit constituted by two p-channel transistors 602 and 603, two n-channel transistors 604 and 605, and a constant current source 601. Further, as a switch of the operational amplifier, n-channel switch transistors 606 and 607 are connected in series with the constant current source. FIG. 6C shows, as the constant current source 601, a current mirror type constant current source made of a load resistance 610, and two n-channel transistors 608 and 609. FIG. 7 shows a current mirror type constant current source made of a load resistance 703 and two p-channel transistors 701 and 702, as a circuit diagram of the constant current source 502 in FIG. 5. Of course, other well-known circuits may be used as the operational amplifier 501 and the constant current source 502.

Next, an operation method of the non-volatile memory of this embodiment mode will be described. Here, writing and readout to the memory cell (1, 1), and simultaneous erasing of the memory cells (1, 1) to (1, m) of the first column will be described. Of course, a similar operation can be carried out for other memory cells as well. Incidentally, in this embodiment mode, the description will be given of the case where each memory transistor stores two-value data, and a verify operation is not carried out at the time of writing.

First, before each operation is carried out, the memory cell of the first column is selected by the X-address decoder. Specifically, the switch transistors 503 to 506 constituting the control circuit 404(1) are turned on by the output signal of the X-address decoder, and all the switch transistor 503 to 506 constituting the control circuits 404(2) to 404(n) are turned off. At the same time with the selection of the control circuit 404(1), an operation mode of the control circuit 404(1) is selected by the erase signal Serase, the write/read signal Sw/r, and the readout signal Sread.

Figure 1A:
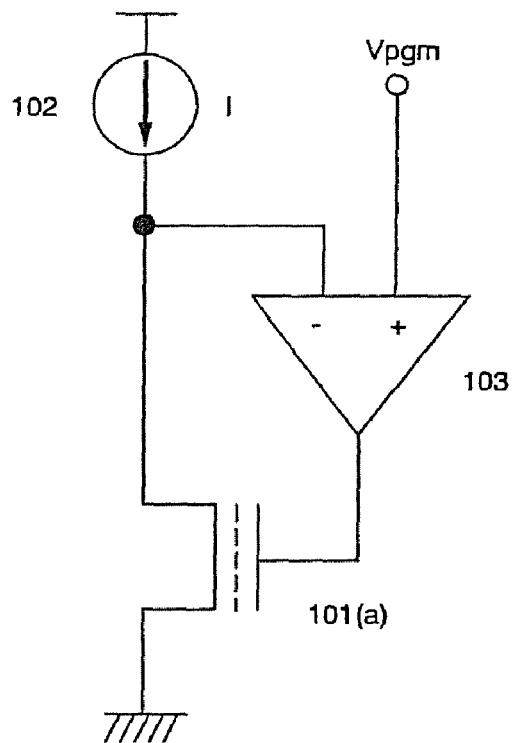
FIGS. 1A and 1B are circuit diagrams for explaining a writing operation of a non-volatile memory of the present invention.
Figure 1B:
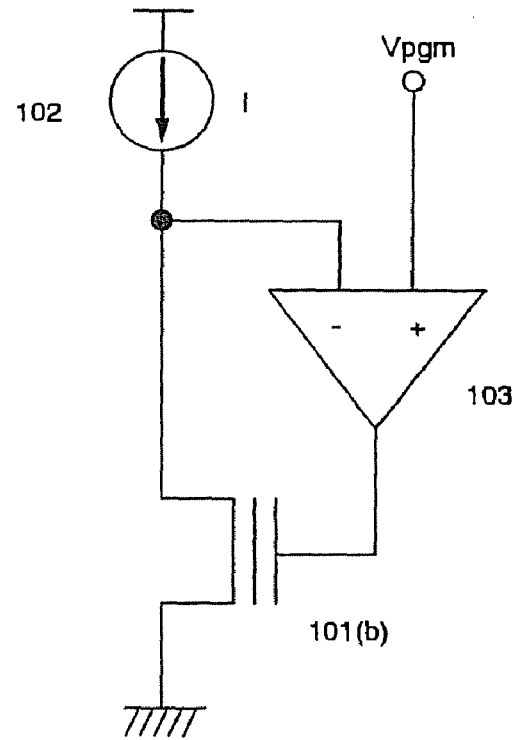
Figure 2:
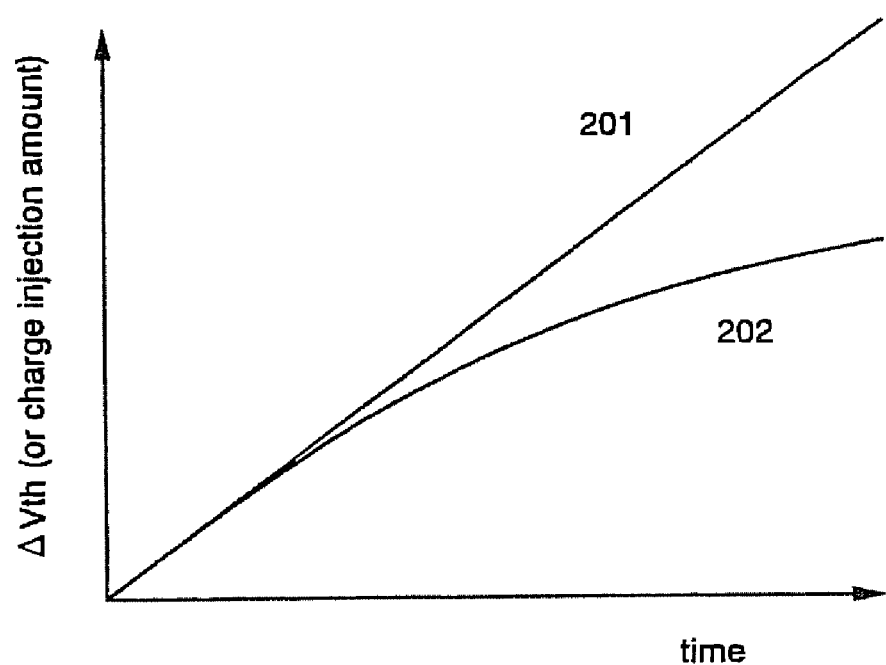
FIG. 2 is a view showing a relation between a threshold voltage of the non-volatile memory of the present invention and a writing time.
Figure 3:
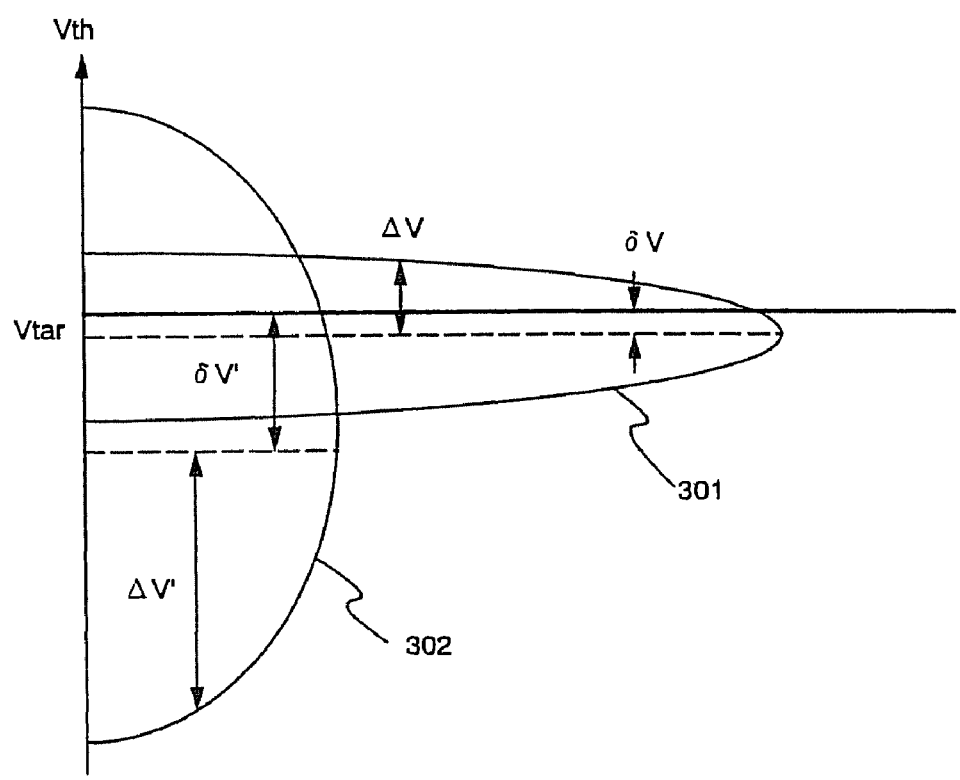
FIG. 3 is a view showing a threshold distribution after the writing operation of the non-volatile memory of the present invention.
Figure 8:
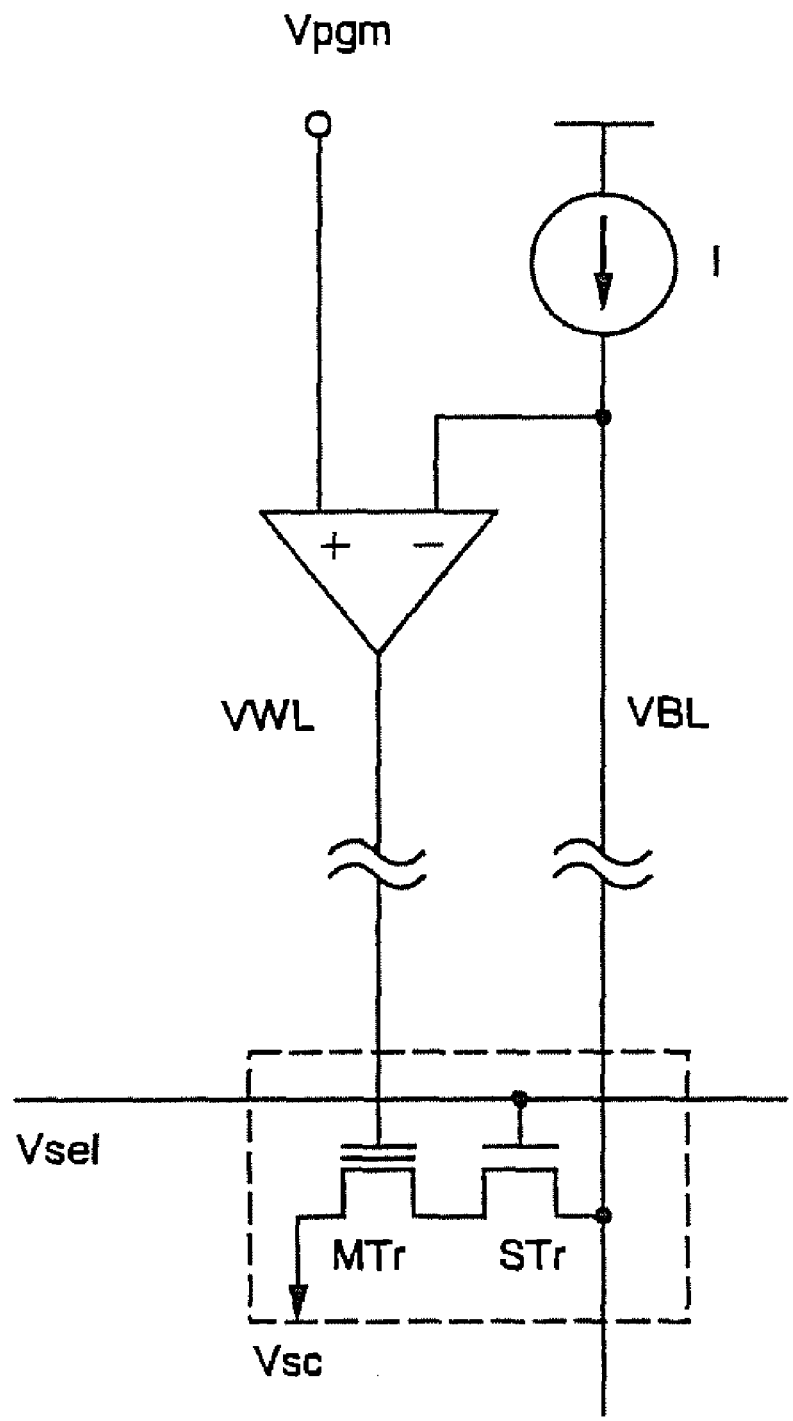
FIG. 8 is a circuit diagram for explaining a writing operation of the non-volatile memory of the present invention.

All the switch transistors 509 and 510 connected to the erase signal Serase and the readout signal Sread are turned off in the writing operation. Hereinafter, a signal by which all switch transistors connected to a signal line are turned off is called an off signal, and a signal by which all switch transistors connected to a signal line are turned on is called an on signal. That is, the off signal is inputted as the erase signal Serase and the readout signal Sread. On the other hand, the on signal is inputted as the write/read signal Sw/r. As a result, a circuit structure concerned with the writing operation to the memory cell (1, 1) can be expressed as in FIG. 8. In FIG. 8, reference character VWL designates a potential of the word line; VBL, a potential of the bit line; Vsc, a potential of the common source line; Vsel, a potential of the selection line; Vpgm, a writing potential; and I, a current supplied by the constant current source. The circuit diagram shown in FIG. 8 is the same as the circuit diagram shown in FIG. 1 except for the selection transistor STr, and the operation principle thereof is the same as that already described.

Figure 9:
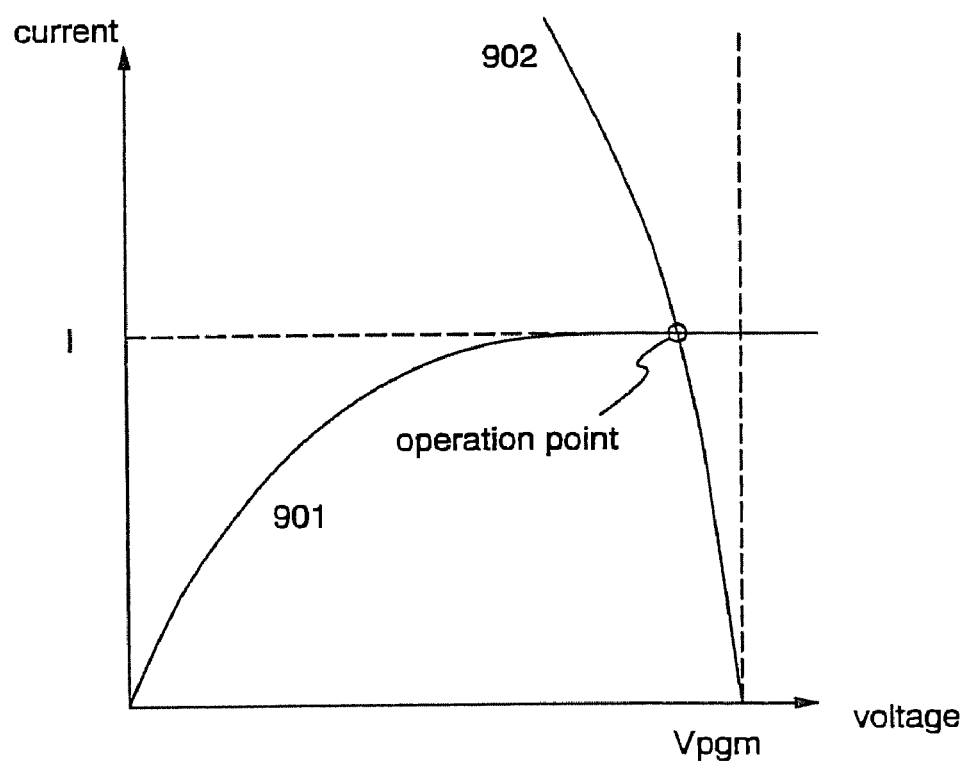
FIG. 9 is a view showing an operation point at the time of writing of the non-volatile memory of the present invention.

The operation voltage at the time of writing may be made, for example, Vsel=10V, Vsc=GND, Vpgm=6 V, and I=10 mA. An operation point of the memory transistor in this case is shown in FIG. 9. Curves 901 and 902 respectively express Vd-Id curves of the memory transistor MTr and the selection transistor STr, and the operation point of the memory transistor MTr is expressed by an intersection P of the two curves. Here, the conductance of the selection transistor STr is set sufficiently larger than the conductance of the memory transistor MTr. It is preferable that the operation voltage at the time of writing is set such that the writing voltage Vpgm is made to have such a magnitude that weak impact ionization occurs, and the operation point of the memory transistor is set to be within a saturation region close to a linear region.

The writing operation in which a charge injection speed to the memory cell (1, 1) is constant becomes possible by the foregoing writing method. In this embodiment mode, the memory transistor stores one-bit (two values of "0" and "1") information, nothing is done in the case where "0" is written, and the foregoing writing operation is carried out for the time tw in the case where "1" is written. Incidentally, it is assumed that the writing operation is carried out in the state where threshold voltages Vth are well uniform. The time tw is a writing time necessary for obtaining the state of "1" and is obtained in advance. In this embodiment mode, the verify operation is thus not carried out, but only the writing operation for the time tw is carried out, so that the writing time can be greatly shortened as compared with the conventional verify writing. Of course, the reason why such writing operation is enabled is that the threshold distribution having high accuracy and a small distribution width can be obtained by the writing method of the present invention.

In the memory cells (2, 1) to (m, 1) in which writing is not carried out, the potential Vsel of the selection line is made 0 V, and the selection transistors are turned off. Further, it is necessary to set the operation voltage at the time of writing so that the potential VWL of the word line at the time of writing has such a degree that erroneous writing by a tunnel current is not carried out in the memory cells (2, 1) to (m, 1). Besides, with respect to the memory cells other than those of the first column, the control circuits 404(2) to 404(n) are in non-selection states, and both the bit line and the word line are brought into floating states, so that there is no problem of erroneous operation.

Of course, in a column in which the control circuit 404 is in the non-selection state, a circuit may be structured so that the bit line and the word line have 0 V.

Figure 10:
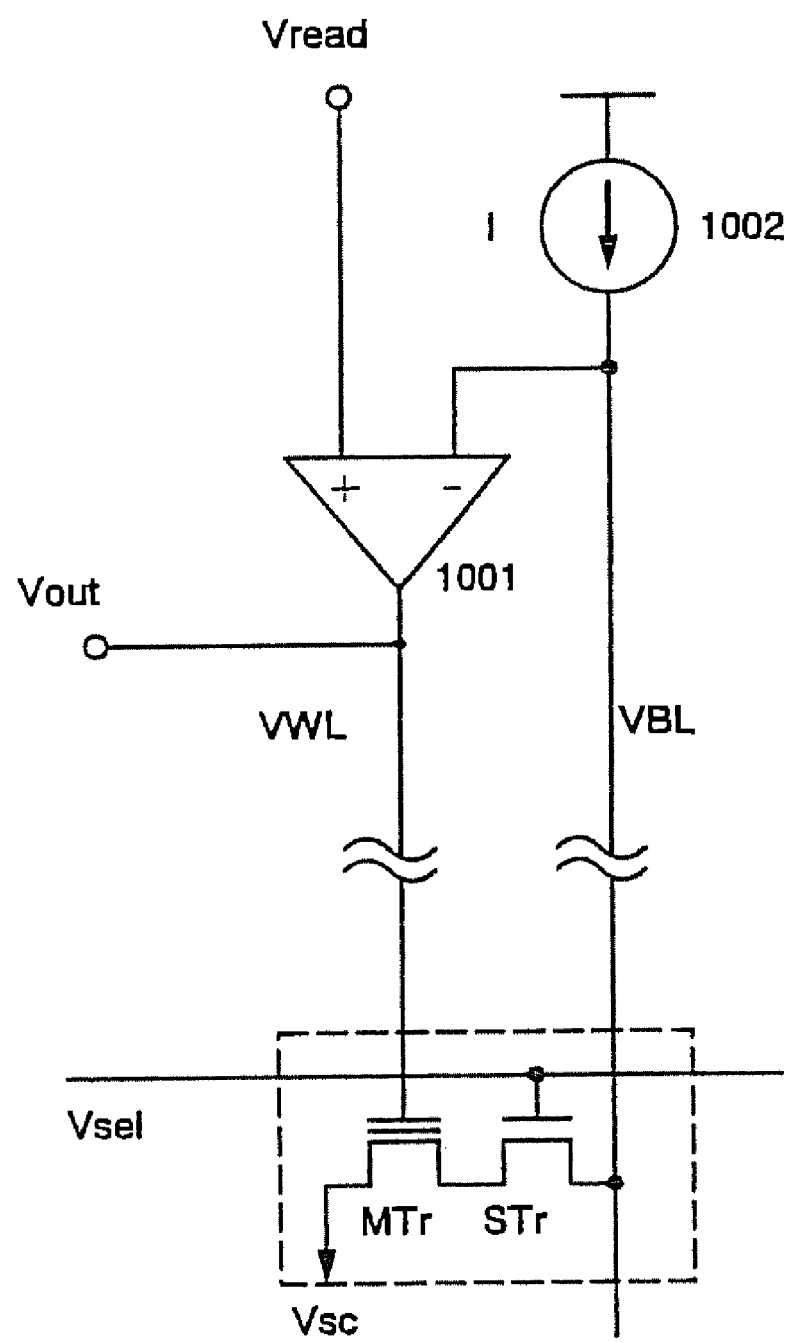
FIG. 10 is a circuit diagram for explaining a readout operation of the non-volatile memory of the present invention.

Next, a readout operation will be described. In the readout operation, the off signal is inputted as the erase signal Serase, and the on signal is inputted as the write/read signal Sw/r and the readout signal Sread. As a result, a circuit structure concerned with the readout operation to the memory cell (1, 1) can be expressed as in FIG. 10. In FIG. 10, reference character VWL designates a potential of the word line; VBL, a potential of the bit line; Vsc, a potential of the common source line; Vsel, a potential of the selection line; and Vout, a readout potential to be outputted. A potential Vread is inputted to an operational amplifier 1001, and a constant current I is supplied from a constant current source 1002. The circuit diagram shown in FIG. 10 is identical with the circuit diagram shown in FIG. 1 except for the selection transistor STr and an output portion of the readout potential Vout, and the operation principle thereof is the same as that already described.

Figure 11:
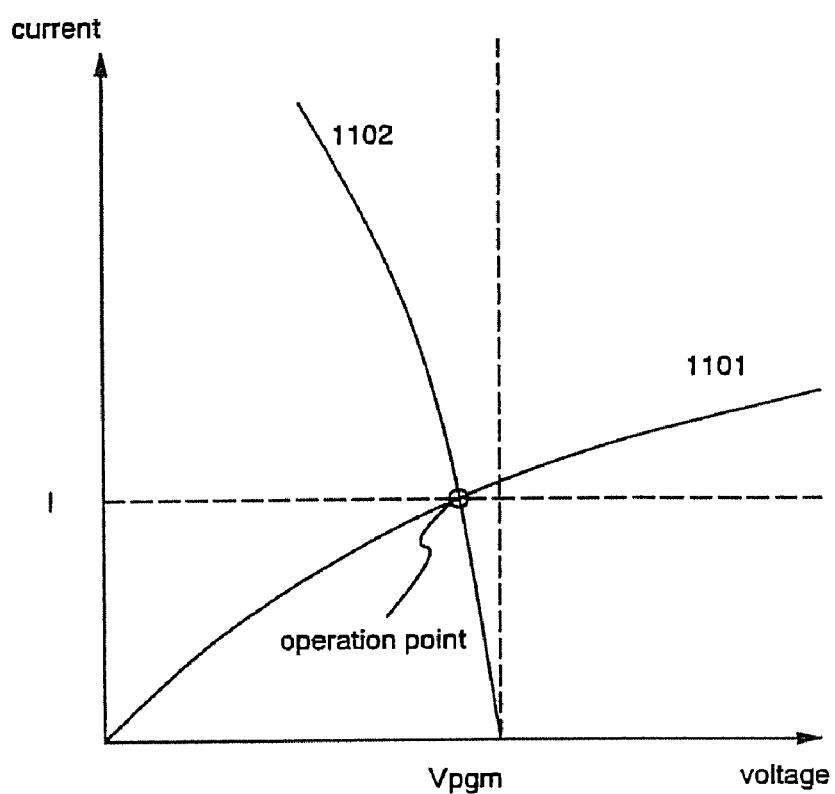
FIG. 11 is a view showing an operation point at the time of readout of the non-volatile memory of the present invention.

The operation voltage at the time of readout may be made, for example, Vsel=3 V, Vsc=GND, Vread=1 V, and I=1 mA. An operation point of the memory transistor in this case is shown in FIG. 11. Curves 1101 and 1102 respectively express Vd-Id curves of the memory transistor MTr and the selection transistor STr, and the operation point of the memory transistor MTr is expressed by an intersection P of the two curves. Incidentally, the conductance of the selection transistor STr is set sufficiently larger than the conductance of the memory transistor MTr. It is necessary that the operation voltage at the time of readout is made to satisfy conditions under which hot electrons are not generated by impact ionization. For that purpose, as shown in FIG. 11, it is appropriate that Vread is set low.

Then, data stored in the memory cell can be read out by reading the readout potential Vout under this operation voltage. This readout operation uses a phenomenon that when the threshold voltage of the memory transistor MTr is increased by $\Delta$Vth, the control gate voltage of the memory transistor MTr, that is, the readout potential Vout is also increased by $\Delta$Vth due to negative feedback characteristics of the control circuit 404(1).

In the memory cells (2, 1) to (m, 1) in which readout is not carried out, the potential Vsel of the selection line is made 0 V, and the selection transistor is turned off. As a result, the readout potential Vout is determined only for the memory cell (1, 1), and there is no fear of erroneous readout. Besides, since the operation voltage is low, there is also no problem of erroneous writing. Also with respect to the memory cells other than those of the first column, the control circuits 404(2) to 404(n) are in non-selection states, and both the bit line and the word line are in floating states, so that there is no problem of erroneous operation.

Of course, in a column in which the control circuit 404 is in the non-selection state, a circuit may be structured such that the bit line and the word line have 0 V.

Incidentally, in this embodiment mode, although the method of reading the word line potential is adopted as the readout method, a method of reading out a bit line potential can also be used.

Figure 12:
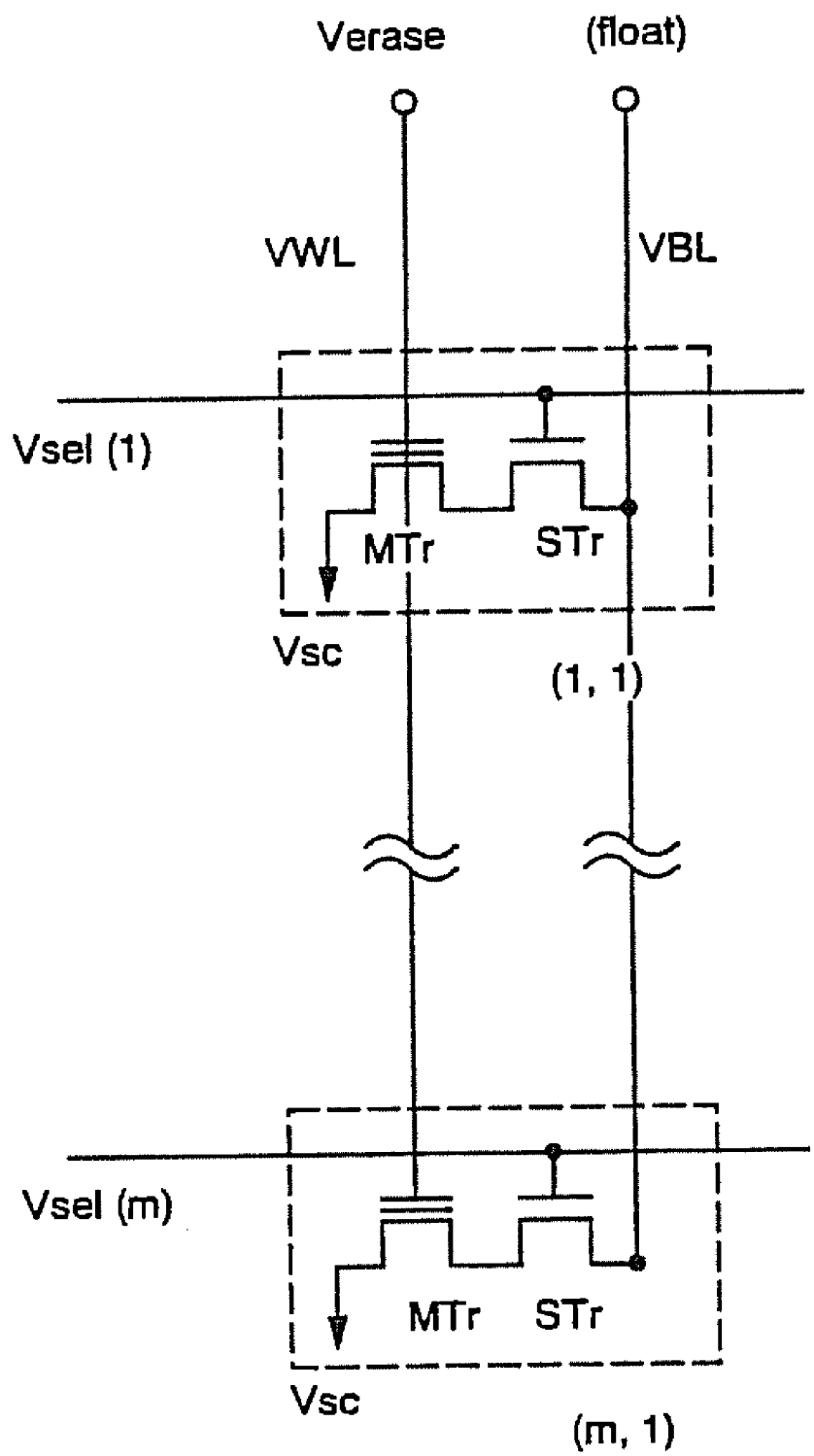
FIG. 12 is a circuit diagram for explaining an erase operation of the non-volatile memory of the present invention.

Finally, an erase operation will be described. At the time of the erase operation, the on signal is inputted as the erase signal Serase, and the off signal is inputted as the write/read signal Sw/r and the readout signal Sread. As a result, a circuit structure concerned with the erase operation to the memory cells (1, 1) to (m, 1) is expressed as in FIG. 12. In FIG. 12, reference character VWL designates a potential of the word line; Vsc, a potential of the common source line; and Vsel(1) to Vsel(m), potentials of the selection lines. As shown in FIG. 12, in the erase operation, an operational amplifier and a constant current source do not participate.

As the operation voltage at the time of erasing, it is appropriate that for example, VWL is made −8 V, potentials Vsel(1) to Vsel(m) of all selection lines are made 0 V, and a substrate potential (or well potential) is made 8 V. As a result, a high potential difference is generated between the control gate and the substrate of the memory transistor constituting the memory cell of the first column, and a charge stored in the floating gate is drawn into the substrate by an FN tunnel current. Incidentally, the selection transistor is turned off, and the drain region of the memory transistor is brought into the floating state. With respect to the memory cells other than those of the first column, the control circuits 404(2) to 404(n) are in the non-selection state, and the word line is in the floating state, so that there is no problem of erroneous erasing. Incidentally, instead of making the substrate potential 8 V, it is also possible to provide a partially overlapping region (overlap region) between the source region and the floating gate of the memory transistor, and to make the common source potential Vsc 8 V.

In order to decrease a distribution width after a writing operation in which a verify operation is not carried out, it is naturally necessary that a distribution width of a threshold voltage before writing is small. However, in the foregoing erase operation, it is generally difficult to realize a narrow distribution width. Then, in this embodiment mode, after the erase operation by the FN tunnel, verify writing into an erase state is newly carried out. It is preferable that the threshold voltage of the erase state is made a value slightly higher than that of the distribution after erasing. Incidentally, a well-known circuit structure and a well-known operation method may be used in the verify writing into the erase state.

In the manner as described above, the writing operation, the readout operation, and the erase operation of the non-volatile memory of the present invention are carried out. The operation voltages explained in this embodiment mode are summarized as shown in Table 1. Incidentally, in Table 1, an operation voltage in the case where, as an erase method, a charge is drawn into a source region is written.

TABLE 1

|  | Writing time | Readout time | Erase time |
| --- | --- | --- | --- |
| Sw/r | ON | ON | OFF |
| Sread | OFF | ON | OFF |
| Serase | OFF | OFF | ON |
| Vpgm/Vread | 6 V | 1 V | — |
| I | 10 mA | 1 mA | — |
| Vsel | 10 V | 3 V | 0 V |
| Vsc | 0 V | 0 V | 8 V |
| Verase | — | — | −8 V |

In this embodiment mode, the two-value non-volatile memory has been described. However, the present invention is not limited to the two-value non-volatile memory. Rather, since the feature of the non-volatile memory of the present invention exists in high accuracy threshold controllability, its effect is exhibited especially in a multi-value non-volatile memory in which a margin of a threshold distribution is small. When the present invention is applied to the multi-value non-volatile memory, as compared with the prior art, the writing time can be shortened, and a high multi-value degree can be realized. With respect to an example in which the present invention is applied to the multi-value memory, reference can be made to embodiment 1. Incidentally, in the present specification, the number of states which one memory cell can store is called a multi-value degree.

Besides, in this embodiment mode, although the writing method in which the verify operation is not performed has been described, a writing method using a verify operation may be carried out, of course. In that case, it is appropriate that the writing operation is constituted by a first writing operation in which the verify operation is not carried out and a second writing operation in which the verify operation is carried out. Specifically, it is preferable that first, in the first writing operation, high accuracy threshold control characteristics are actively used, and writing into a state slightly lower than a final threshold voltage is carried out, and then, verify writing as to an insufficiency of remaining threshold voltage is carried out. As a result, as compared with the conventional verify writing, the number of times of verify operation can be decreased, and a verify writing time can be shortened. Incidentally, a well-known circuit structure and a well-known operation method may be used for the verify writing.

In this embodiment mode, although the writing and readout to the memory cell (1, 1) and the simultaneous erasing of the memory cells (1, 1) to (m, 1) of the first column has been described, it is also possible to simultaneously carry out these operations over plural columns. Especially, by selecting all the control circuits 404(1) to 404(n), it is possible to carry out the simultaneous writing and readout to the memory cells (1, 1) to (1, n) of the first row, and the simultaneous erasing of all the memory cells. Of course, as the write/read circuit 405, a circuit capable of processing n-bit data in parallel becomes necessary. Besides, it is necessary that the total of amounts of currents simultaneously flowing in the respective operations does not exceed current driving capacity of the circuit.

Incidentally, since the writing method of the present invention uses negative feedback, there may be a case where it takes a time until the operation voltage becomes stable. Thus, it is preferable that as the need arises, a discharge circuit or a precharge circuit is provided in the control circuit to shorten a period of time until it takes the operation voltage becomes stable.

Embodiment 1

In this embodiment, a description will be given of an example in which a non-volatile memory of the present invention is applied to a multi-value memory. The non-volatile memory of the present invention is characterized by a writing operation superior in controllability of threshold voltage, and its effect is exhibited especially in a multi-value non-volatile memory in which a margin of a threshold distribution is small. In the multi-value non-volatile memory to which the present invention is applied, it is possible to shorten a writing time as compared with the prior art, and can realize a high multi-value degree.

Figure 13:
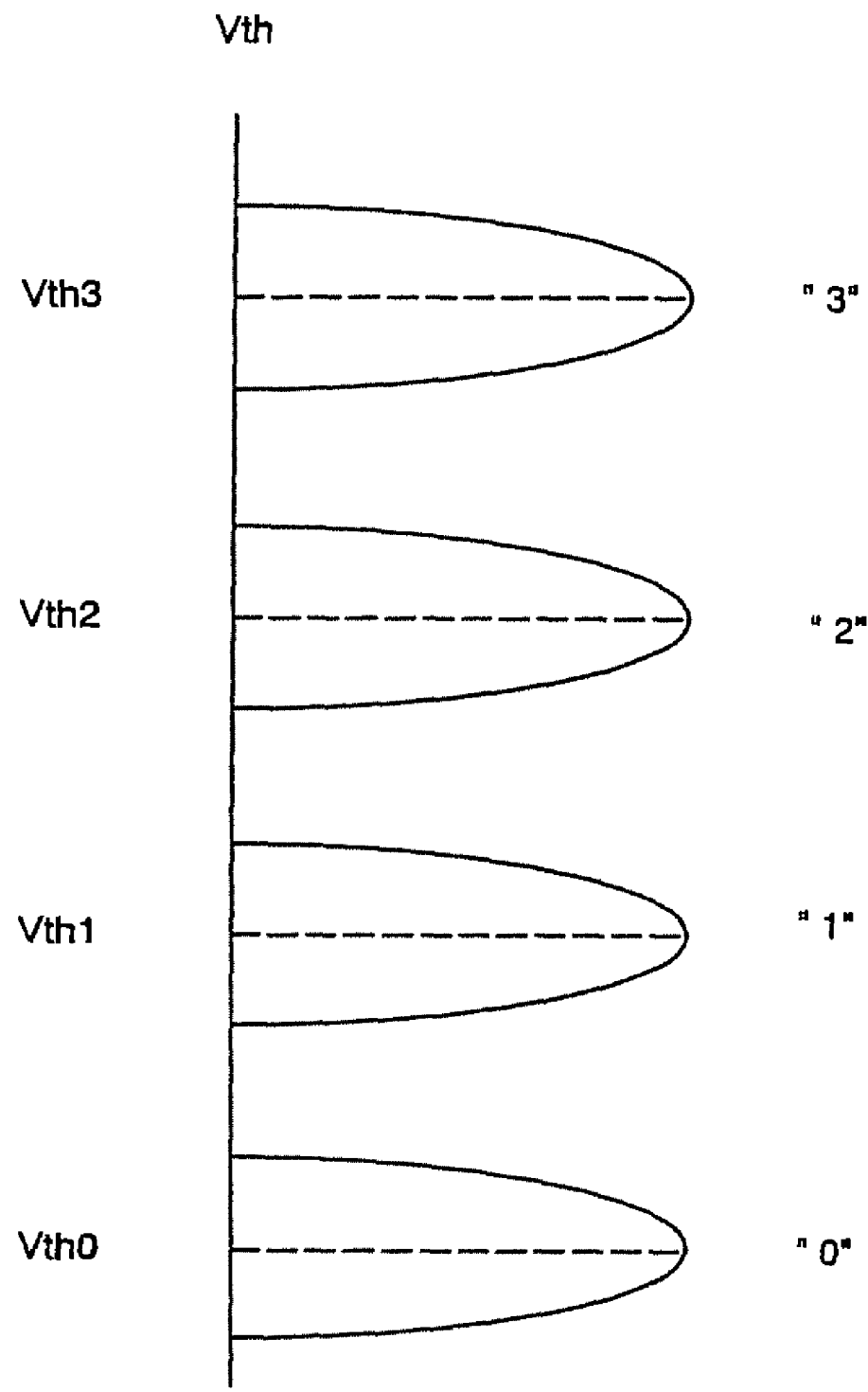
FIG. 13 is a view showing a threshold distribution of the non-volatile memory of the present invention.

The multi-value non-volatile memory is constituted by a memory element capable of storing three or more states. For example, there is a method of dividing a threshold voltage of a memory element into three or more states, or a method of using a memory element capable of storing electric charges in plural places. In this embodiment, a description will be given of a four-value non-volatile memory in which the threshold voltage of the memory element is divided into four states, and four states of "0" (erase state), "1", "2" and "3" are stored. IG. 13 shows distributions of the threshold voltages expressing the four states. In FIG. 13, Vth0, Vth0, Vth2, and Vth3 are respectively center values of the threshold distributions of the states "0", "1", "2" and "3".

Figure 14:
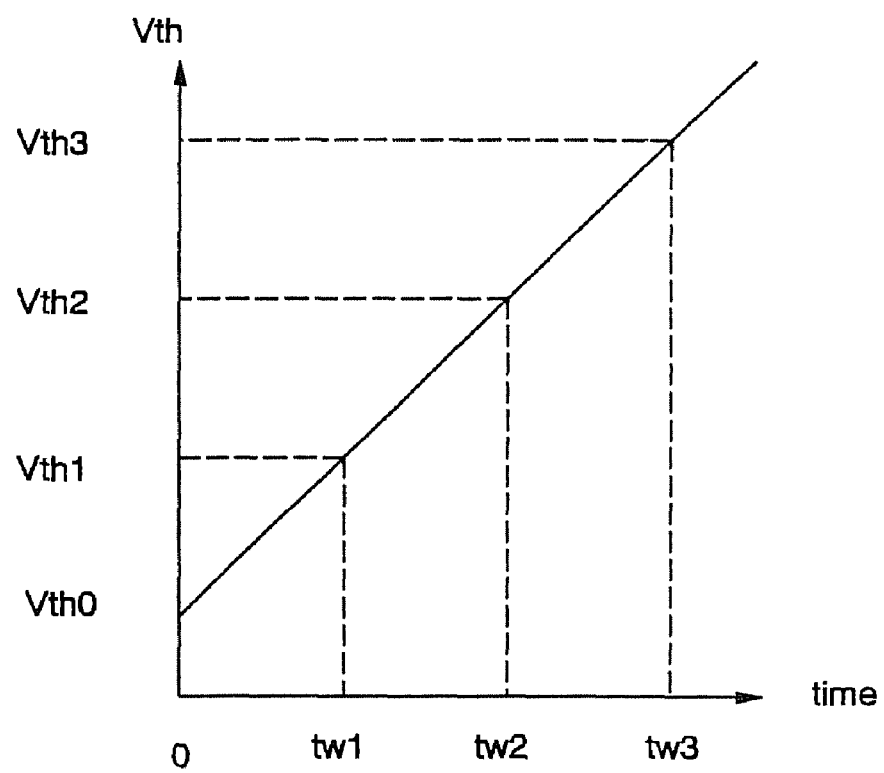
FIG. 14 is a view showing the relation between the threshold voltage of the non-volatile memory of the present invention and the writing time.

FIG. 14 shows a relation between the threshold voltage of the memory element and a writing time in the case where the writing method of the present invention is used. In FIG. 14, times tw1, tw2, and tw3 respectively designate writing times from the erase state "0" to the states "1", "2" and "3". Since the threshold voltage and the writing time have a linear relation, in the case where intervals between the threshold voltages of the four states are equal to one another, ratios between tw1, tw2 and tw3 become tw1: tw2: tw3=1:2:3. Like this, in the writing method of the present invention, writing into the respective states can be carried out easily and with high accuracy by controlling the writing time. More generally, in the case where writing is carried out by one writing operation, it is appropriate that the ratios between necessary writing times are made coincident with the ratios between intervals of threshold voltages in the respective states.

For example, in the case where the memory element stores states of k values not lower than two values by dividing them into the erase state having the threshold voltage Vth0 and the states having (k−1) different threshold voltages Vth1, Vth2, Vth(k−1) higher than the threshold voltage Vth0, it is appropriate that the ratios between the writing times tw1, tw2, . . . , tw(k−1) for writing from the erase state to the states having the threshold voltages Vth1, Vth2, Vth(k−1) are made tw1:tw2: . . . :tw(k−1)=(Vth1−Vth0):(Vth2−Vth0): . . . :(Vth(k−1)−Vth0).

Hereinafter, a circuit structure and an operation method of the four-value non-volatile memory of the present invention will be described. For simplification, it is assumed that threshold distributions expressing four-value states are as shown in FIG. 13, and intervals between threshold voltages of the respective states are equal to one another.

The circuit structure of the multi-value non-volatile memory may be basically made equal to that of the two-value non-volatile memory, and with respect to a memory cell array, an address decoder, a control circuit, and the like, the same circuits as those of the circuit diagrams shown in FIGS. 4 to 7 can be used. The multi-value circuit structure is different from the two-value circuit structure mainly in a readout circuit and a writing circuit. In the four-value non-volatile memory, it is necessary that the readout circuit distinguishes between four states and read them out as two-bit data, and the writing circuit carries out writing into the four states on the basis of the two-bit data. Accordingly, the readout circuit and the writing circuit become different for every non-volatile memory (including that of two values) different in the multi-value degree.

As the writing method, one writing operation in which a verify operation is not carried out is considered. In this case, it is appropriate that on the basis of the inputted two-bit data, the writing operation in which the writing time is 0, tw1, tw2, or tw3 is carried out. The writing operation may be made similar to the method explained in this embodiment mode, and the on pulse signal having a width of 0, tw1, tw2 or tw3 may be inputted as the write/read signal. Of course, it is desirable to use, as the operation voltage, an optimum value determined by the writing time and the like. In the writing method of the present invention, since a charge injection speed is constant, writing can be carried out by simple time control in which the ratios of the writing times to the four states become 0:1:2:3.

As the readout method, first, similarly to the two-value memory, the readout potential Vout is read out of the control circuit. The readout circuit judges the states "0", "1", "2" and "3" according to the value of the read Vout, and conversion into two-bit data is carried out. As the readout circuit, a well-known readout circuit used for a conventional multi-value non-volatile memory can be used.

As the erase method, since it is appropriate that erasing to "0" (erase state) is carried out irrespective of the state of the memory element, similarly to the two-value memory, the erase operation by the FN tunnel current may be carried out. Incidentally, in the case where the verify operation is not carried out in writing, since it is necessary to make threshold voltages before writing uniform, similarly to the case explained in this embodiment mode, it is preferable that the verify writing into the erase state "0" is carried out after the FN tunnel erasing. A well-known circuit structure and a well-known operation method may be used for verify writing into the erase state "0".

Figure 15:
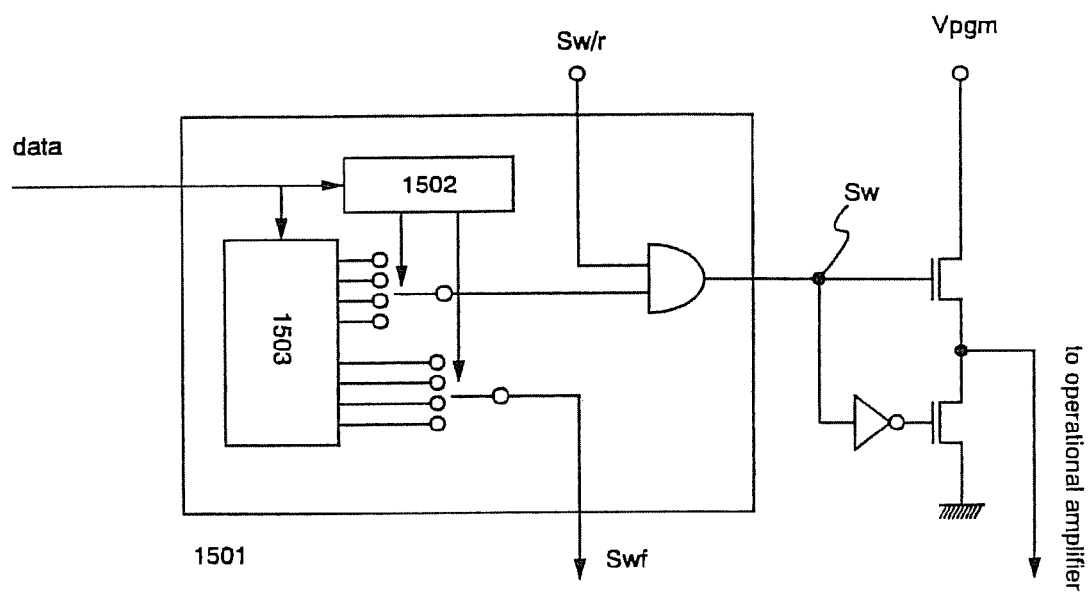
FIG. 15 is a diagram of a writing circuit of the non-volatile memory of the present invention.

The example of the writing operation will be described in more detail. FIG. 15 shows an example of a writing circuit diagram. A writing circuit 1501 is constituted by a latch 1502, a pulse generation circuit 1503, and the like. When two-bit writing data is inputted to the writing circuit 1501, it is held by the latch 1502, and a plurality of signals are formed by the pulse generation circuit 1503. These signals are suitably selected in accordance with the data held in the latch 1502, and are outputted as a writing pulse signal Sw and a writing finish signal Swf.

Figure 16:
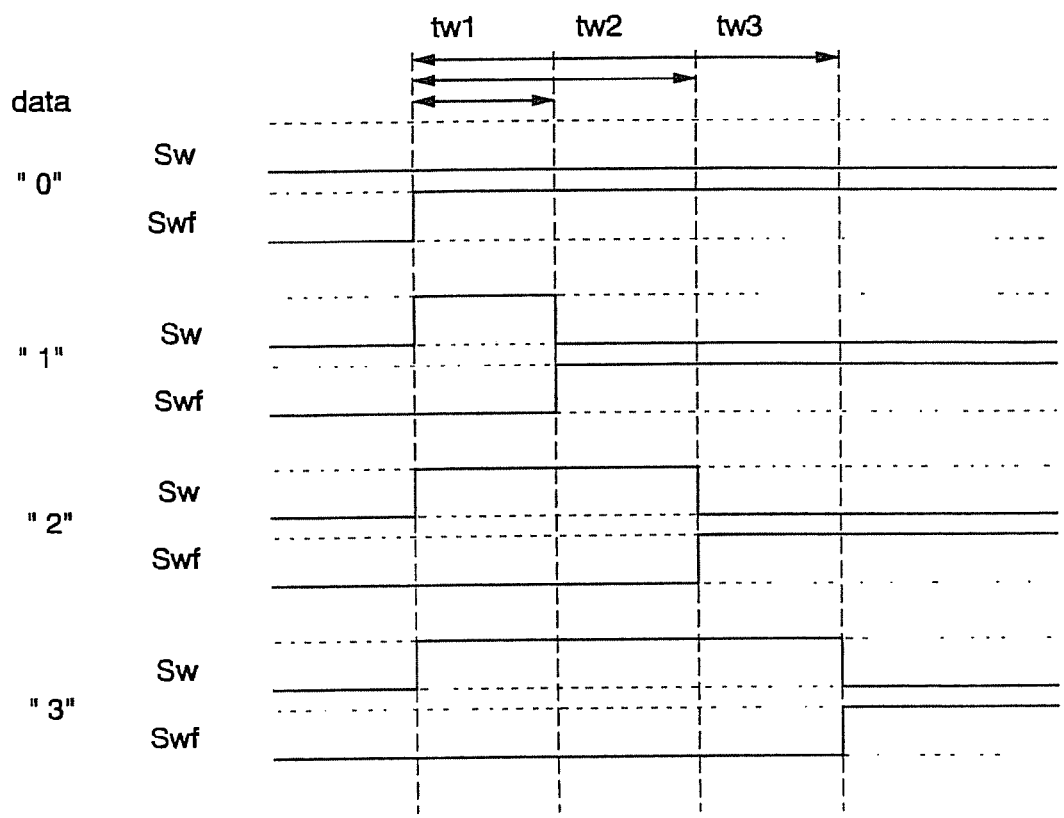
FIG. 16 is a timing chart at the time of writing of the non-volatile memory of the present invention.

FIG. 16 shows a timing chart of the writing pulse signal Sw and the writing finish signal Swf. As shown in FIG. 16, the writing pulse signals Sw have different pulse widths on the basis of the inputted data, and the writing finish signal Swf rises after the writing pulse falls down and notifies the finish of the writing. Specifically, in the case where data corresponding to the states "0", "1", "2", or "3" is inputted, the writing signal Sw has the pulse width of 0, tw1, tw2 or tw3, respectively.

The outputted writing pulse signal Sw is connected to the input terminal of an operational amplifier and a switch transistor for switching the connection with Vpgm and GND. In the case where the writing pulse signal Sw is on, Vpgm is connected to the input terminal of the operational amplifier, and in the case where it is off, GND is connected to the input terminal of the operational amplifier.

In the foregoing pulse generation circuit 1503, for example, three rising signals in which a time is shifted by tw1, tw2 and tw3 are prepared by a shift register, and pulses having different widths can be prepared by taking an exclusive OR (XOR) to the original signal. The writing pulse signal Sw may be selected from the pulse signals having different widths, and the writing finish signal Swf may be selected from the rising signals shifted in time, on the basis of the input data.

In the manner described above, the writing operation, the readout operation, and the erase operation of the non-volatile memory of the present invention are carried out.

In this embodiment, although the description has been given of the four-value case in behalf of the multi-value memory, the present invention can be applied to the multi-value memory of 8 values, 16 values, or higher values quite similarly to this embodiment. Besides, in this embodiment, although the description has been given of the case where intervals between the threshold distributions expressing the multi-value states are uniform, even in the case where the intervals between the threshold distributions expressing the multi-value states are not uniform, a completely similar operation can be carried out by merely changing the writing pulse width.

In the writing operation of the present invention, as compared with the prior art, the distribution width of the threshold voltage after writing is small, and the controllability of the distribution is superior, so that also in the multi-value non-volatile memory, it becomes possible to carry out writing by one writing operation in which the verify operation is not carried out. Also in the case where the verify operation is carried out, first, writing (first writing) into a state in which threshold voltage is slightly lower than a state after writing is carried out, and next, verify writing (second writing) is carried out, so that it becomes possible to greatly shorten the writing time. Incidentally, verify writing may be started after confirmation of the rising of the writing finish signal Swf. Although a verify writing circuit is not shown, a well-known circuit structure and a well-known operation method may be used.

Figure 17:
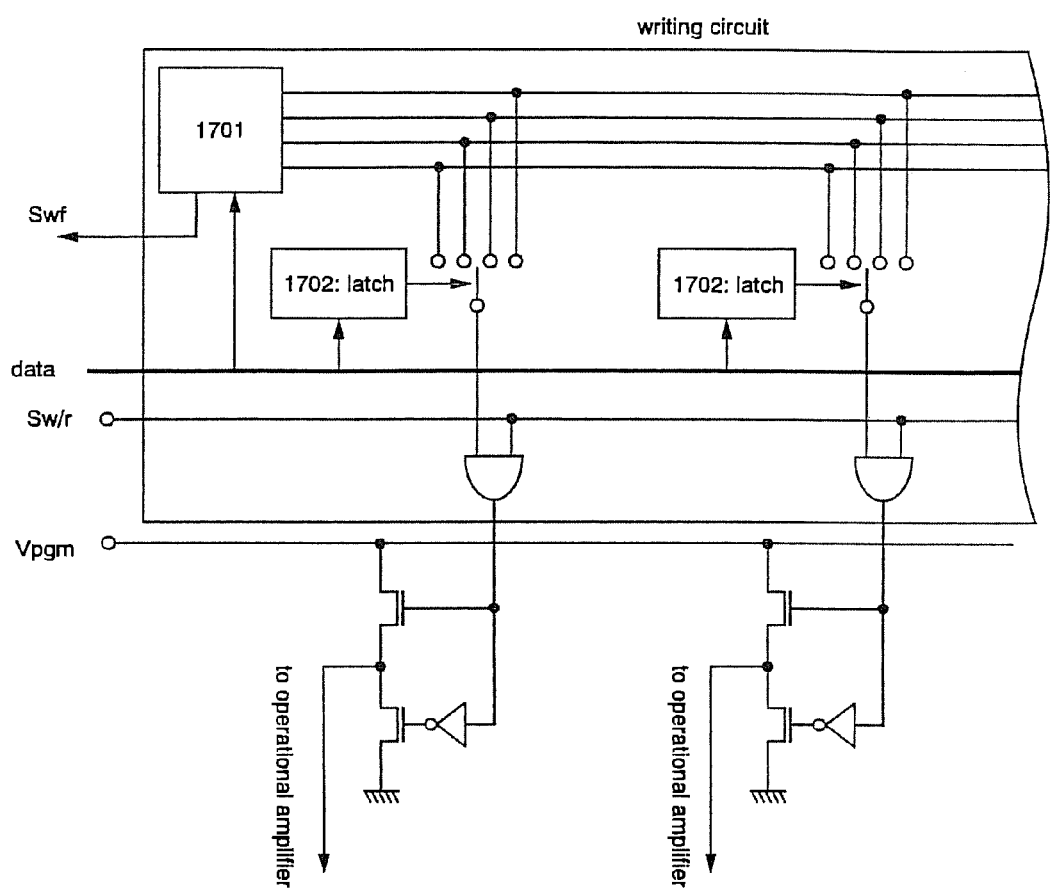
FIG. 17 is a diagram of a writing circuit of the non-volatile memory of the present invention.

Besides, the foregoing operation method of the multi-value memory can be carried out simultaneously over plural columns. In that case, a writing circuit diagram as shown in FIG. 17 can be used. In FIG. 17, a latch 1702 is provided for each column, and in accordance with data held in the latch 1702, a suitable writing pulse signal is selected from a common pulse generation circuit 1701. As a writing finish signal Swf, it is appropriate that for example, a signal rising after a writing time tw3 is used. In this way, by making the writing operation, the readout operation, and the erase operation parallel, the speed of the operation can be made high.

Incidentally, as a method of controlling a threshold voltage with high accuracy, although the control method using time as described above is preferable, more generally, the writing voltage Vpgm and the writing time are freely set and the writing operation to the respective multi-value states may be carried out.

Embodiment 2

Figure 18:
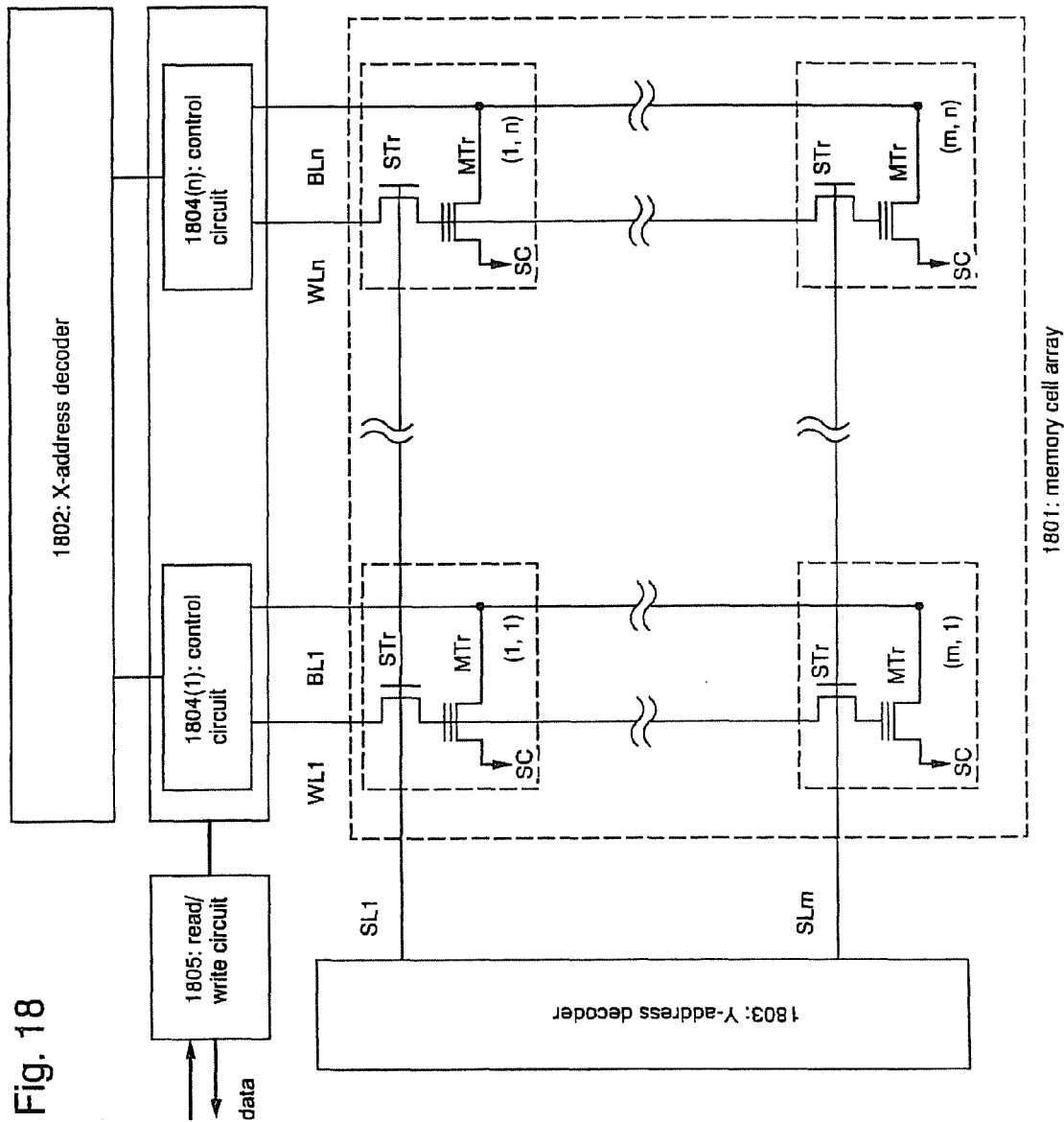
FIG. 18 is a view showing the whole structure of the non-volatile memory of the present invention.

In this embodiment, a description will be given of an example which is different from the circuit structure of the non-volatile memory described in this embodiment mode. FIG. 18 is a circuit diagram of a non-volatile memory of this embodiment including a memory cell array of m rows and n columns (m and n are respectively integers equal to or larger than 1). The non-volatile memory shown in FIG. 18 is constituted by a memory cell array 1801, an X-address decoder 1802, a Y-address decoder 1803, control circuits 1804(1) to 1804(n), a read/write circuit 1805, and other peripheral circuits (not shown). The other peripheral circuits include an address buffer circuit, a power generation circuit, a boosting circuit, a power control circuit, other control circuits, and the like, and are provided as the need arises.

Each memory cell is constituted by a memory transistor MTr and a selection transistor STr. The memory transistor MTr is a transistor including a floating gate, and the selection transistor STr is a normal transistor. As the memory transistor MTr, a memory transistor including a cluster layer, or a memory transistor of MNOS structure or MONOS structure may be used (see embodiment 3).

In FIG. 18, a memory cell (i, j) (1≦i≦m, j≦n) is connected to a selection line SLi, a word line WLj, a bit line BLj, and a common source line SC. Specifically, one of a source and a drain electrodes of the selection transistor STr is connected to a control gate electrode of the memory transistor MTr, the common source line SC is connected to a source electrode thereof, and the bit line BLi is connected to a drain electrode thereof. The word line WLj is connected to the remaining one of the source and the drain electrodes of the selection transistor STr, and the selection line SLi is connected to a gate electrode thereof. The selection lines SL1 to SLm are connected to the Y-address decoder 1803, and the word line WLj and the bit line BLj are connected to the control circuit 1804 (j) (1≦j≦n). Besides, the control circuits 1804(1) to 1804(n) are connected to the X-address decoder 1802 and the read/write circuit 1805.

Figure 19:
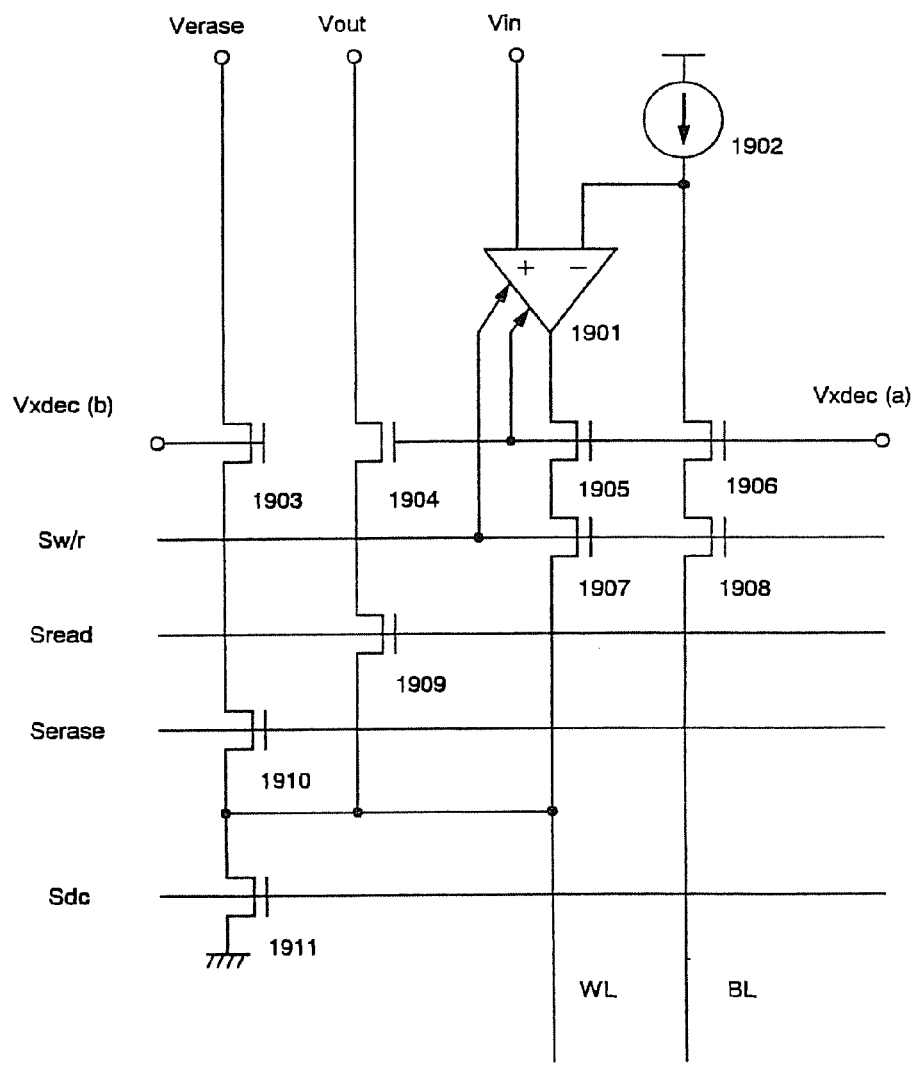
FIG. 19 is a view showing a partial structure of the non-volatile memory of the present invention.

Next, the control circuits 1804(1) to 1804(n) will be described. Since all the n control circuits are quite identical to one another, one of them is called a control circuit 1804 in behalf of them. FIG. 19 shows an example of a circuit diagram of the control circuit 1804, and the control circuit 1804 is constituted by an operational amplifier 1901, a constant current source 1902, and a plurality of switch transistors 1903 to 1911. Since the operational amplifier 1901, the constant current source 1902, and the plurality of switch transistors 1903 to 1910, which constitute the control circuit 1804, are quite identical to those of the control circuit shown in FIG. 5, their explanation is omitted. As circuit diagrams of the operational amplifier 1901 and the constant current source 1902, for example, the circuit diagrams shown in FIGS. 6 and 7 can be used. Of course, another well-known circuit can also be used. The control circuit 1804 is different from the control circuit shown in FIG. 5 in that the former includes a discharge circuit. That is, the word line WL is connected to GND through the switch transistor 1911. A gate electrode of the switch transistor 1911 is connected to a discharge signal Sdc.

Next, an operation method of the non-volatile memory of this embodiment will be described. Here, writing and readout to the memory cell (1, 1) and simultaneous erasing of the first column memory cells (1, 1) to (1, m) will be described. Of course, a similar operation can be carried out for other memory cells. Incidentally, in this embodiment, a description will be given of a case where each memory transistor stores two-value data, and a verify operation is not carried out at the time of writing.

First, before respective operations are carried out, the first column memory cells are selected by the X-address decoder. Specifically, the switch transistors 1903 to 1906 constituting the control circuit 1804(1) are turned on by the output signal of the X-address decoder, and all the switch transistors 1903 to 1906 constituting the control circuits 1804(2) to 1804(n) are turned off. At the same time as the selection of the control circuit 1804(1), the operation mode of the control circuit 1804(1) is selected by the erase signal Serase, the write/read signal Sw/r, and the readout signal Sread.

The feature of the circuit of the memory cell of this embodiment is that the selection transistor is connected between the control gate electrode of the memory transistor MTr and the word line WL. As described below, in the writing and readout operations, since the selection transistor constituting the row in which an operation is not carried out is turned off, the control gate electrode of the memory transistor MTr is brought into the floating state. In the driving method of this embodiment, in order to prevent an erroneous operation from occurring in these memory cells, before the selection transistor is turned off in the writing and readout operations, the control gate electrodes of all the memory transistors MTr are connected to GND using the discharge circuit.

Figure 20:
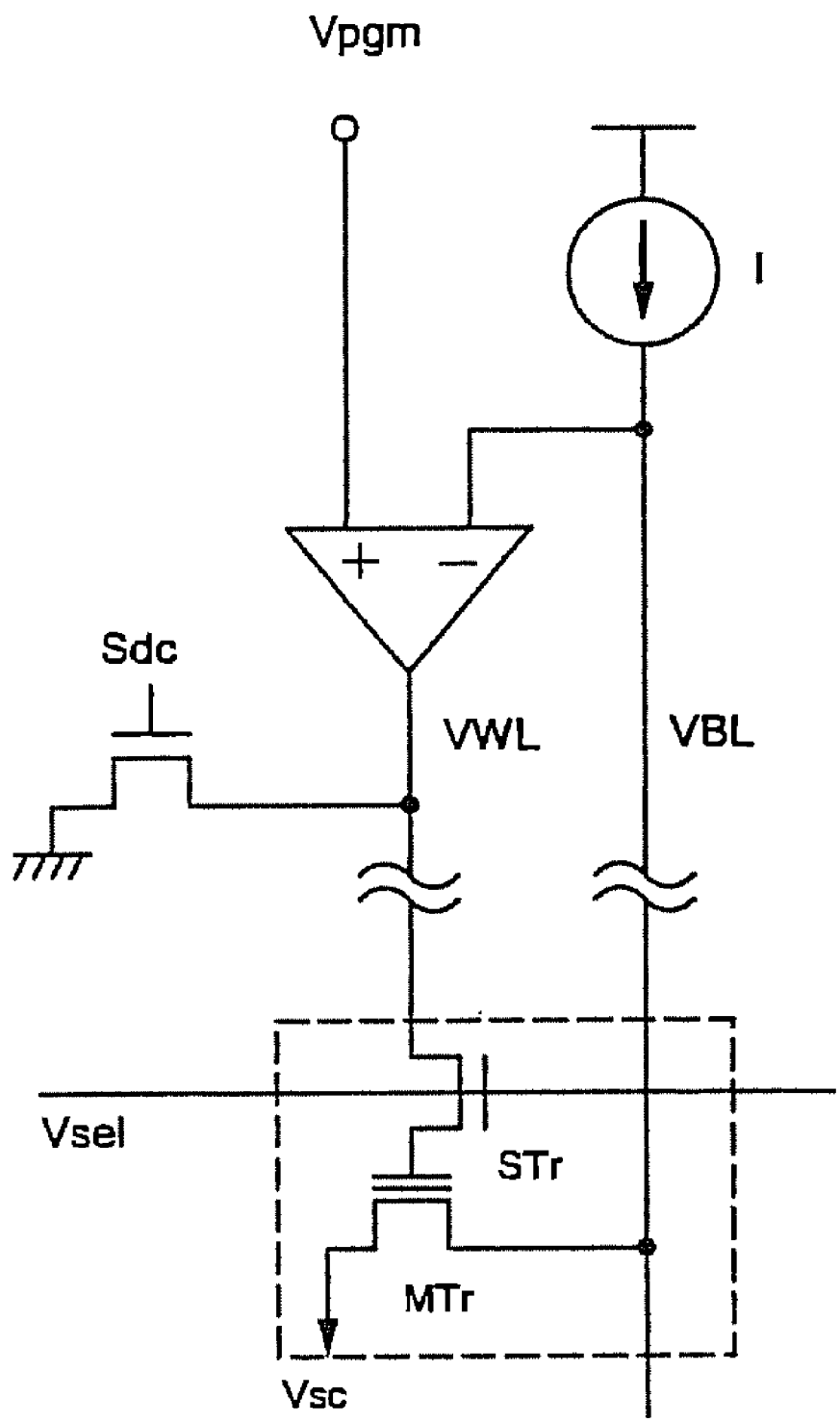
FIG. 20 is a circuit diagram for explaining a writing operation of the non-volatile memory of the present invention.

First, in the writing operation, the off signal is inputted as the erase signal erase and the readout signal Sread, and the on signal is inputted as the write/read signal Sw/r. As a result, a circuit structure concerned with the writing operation to the memory cell (1, 1) is expressed as in FIG. 20. In FIG. 20, reference character VWL designates a potential of the word line; VBL, a potential of the bit line; Vsc, a potential of the common source line; Vsel, a potential of the selection line; Vpgm, a writing potential; I, a current supplied by the constant current source; and Sdc, a discharge signal. The circuit diagram shown in FIG. 20 is coincident with the circuit diagram shown in FIG. 1 except for the selection transistor STr and the discharge circuit, and the operation principle is not described since its explanation has already been given.

The operation voltage at the time of writing may be made, for example, Sdc=0 V, Vsel=12 V, Vsc=GND, Vpgm=6 V, and I=10 mA. It may be considered that the operation point of the memory transistor in this case is substantially the same as the example (see FIG. 9) shown in this embodiment mode. With respect to the operation voltage at the time of writing, it is preferable that the writing voltage Vpgm is made to have such a magnitude that weak impact ionization occurs, and the operation point of the memory transistor is set to be within a saturation region close to a linear region.

In this embodiment, the memory transistor stores one-bit (two values of "0" and "1") information, and in the case where "0" is written, nothing is done, and in the case where "1" is written, the foregoing writing operation is carried out for a previously examined time tw. Incidentally, it is assumed that the writing operation is carried out under the conditions that the threshold voltage Vth is positive and is well uniform.

Thus in this embodiment, since the verify operation is not carried out but the writing operation for the time tw is carried out, so that as compared with the conventional verify writing, the writing time can be greatly shortened. Of course, the reason why such writing operation becomes possible is that the threshold distribution having high accuracy and small threshold distribution can be obtained by the writing method of the present invention.

After the writing operation is carried out for the time tw, the writing operation is finished in the manner described below. First, in the control circuit, the off signal is inputted as the write/read signal Sw/r, and the on signal is inputted as the discharge signal Sdc, so that the potentials of all the word lines WL are connected to GND. At the same time, the potentials Vsel of all the selection liens SL are made 3 V, and after the control gate electrodes of all the memory transistor are connected to GND, the potentials Vsel of all the selection lines SL are connected to 0 V. At the same time, the off signal is inputted as the discharge signal Sdc.

Incidentally, in the writing operation, in the memory cells (2, 1) to (m, 1) in which writing is not carried out, the potential Vsel of the selection line is made 0 V, and the selection transistor is turned of In this case, although the control gate electrodes of the memory transistors constituting the memory cells (2, 1) to (m, 1) are brought into the floating states, as described above, the potential of the control gate is 0 V, and the threshold voltage Vth of the memory transistor is made uniform to be positive, so that the memory transistor is turned off and there is no fear of erroneous operation. With respect to the memory cells other than the first column, since the control circuits 1804(2) to 1804(n) are in the non-selection state, and both the bit line and the word line are in the floating state, there is no problem of erroneous operation.

Of course, in the column in which the control circuit 1804 (i) (i is an integer of 1 to n) is in the non-selection state, a circuit may be constructed such that the bit line and the word line have 0 V.

Figure 21:
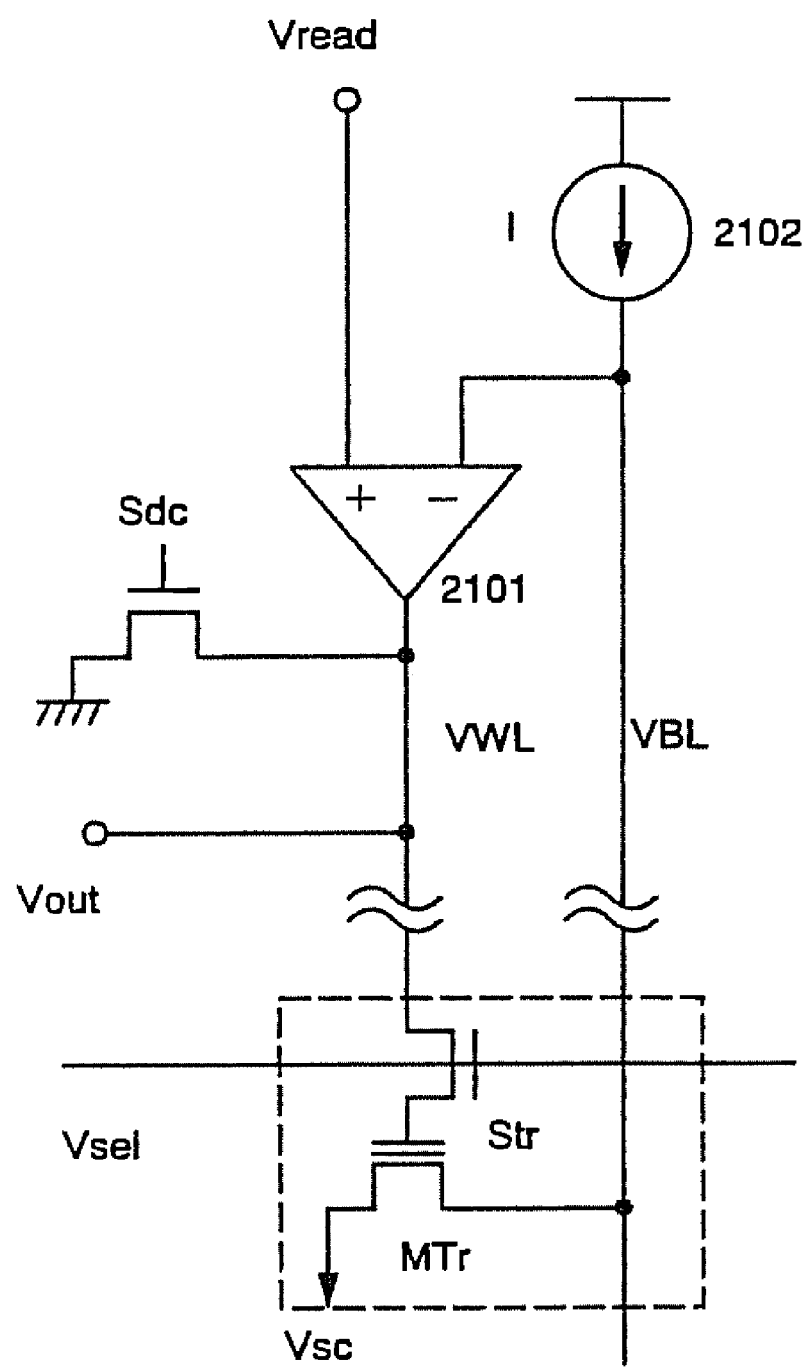
FIG. 21 is a circuit diagram for explaining a readout operation of the non-volatile memory of the present invention.

Next, a readout operation will be described. In the readout operation, the off signal is inputted as the erase signal Serase, and the on signal is inputted as the write/read signal Sw/r and the readout signal Sread. As a result, a circuit structure concerned with the readout operation to the memory cell (1, 1) can be expressed as in FIG. 21. In FIG. 21, reference character VWL designates a potential of the word line; VBL, a potential of the bit line; Vsc, a potential of the common source line; Vsel, a potential of the selection line; Vout, a readout potential to be outputted; and Sdc, a discharge signal. Besides, a potential Vread is inputted to an operational amplifier 2101, and a constant current I is supplied from a constant current source 2102. The circuit diagram shown in FIG. 21 is coincident with the circuit diagram shown in FIG. 1 except for a selection transistor STr, a discharge circuit, and an output portion of the readout potential Vout, and the operation principle is the same as that already explained.

The operation voltage at the time of readout may be made, for example, Sdc=0 V, Vsel=5 V, Vsc=GND, Vread=1 V, and I=1 mA. We may consider that the operation point of the memory transistor in this case is substantially the same as the example (see FIG. 11) shown in this embodiment mode. It is necessary that the operation voltage at the time of readout satisfies the conditions under which hot electrons are not generated by impact ionization. For that purpose, it is appropriate that Vread is set low.

Data stored in the memory cell can be read out by reading the readout potential Vout under this operation voltage. This readout operation uses a phenomenon that when the threshold voltage of the memory transistor is increased by $\Delta$Vth, the control gate voltage of the memory transistor, that is, the readout potential Vout is also increased by $\Delta$Vth through negative feedback characteristics.

Also after the readout operation is carried out, the control gate electrodes of all the memory transistors are connected to GND by a discharge operation. First, in the control circuit, the off signal is inputted as the write/read signal Sw/r, and the on signal is inputted as the discharge signal Sdc, so that the potentials of all the word lines WL are connected to GND. At the same time, the potentials Vsel of all the selection lines SL are made 3V, and after the control electrodes of all the memory transistors are connected to GND, the potentials Vsel of all the selection lines SL are connected to 0 V. At the same time, the off signal is inputted as the discharge signal Sdc.

Incidentally, in the memory cells (2, 1) to (m, 1) in which readout is not carried out, the potentials Vsel of the selection lines are made 0 V, and the selection transistors are turned off. As a result, the memory transistors constituting the memory cells (2, 1) to (m, 1) are turned off, and the readout potential Vout is determined only by the memory cell (1, 1), so that there is no fear of erroneous readout. Besides, since the operation voltage is low, there is no problem of erroneous writing as well. With respect to the memory cells other than the first column, the control circuits 1804(2) to 1804(n) are in the non-selection state, and both the bit line and the word line are in the floating state, so that there is no problem of erroneous operation.

Incidentally, in this embodiment, although the method of reading out the word line potential is adopted as the readout method, a method of reading out a bit line potential can also be used.

Figure 22:
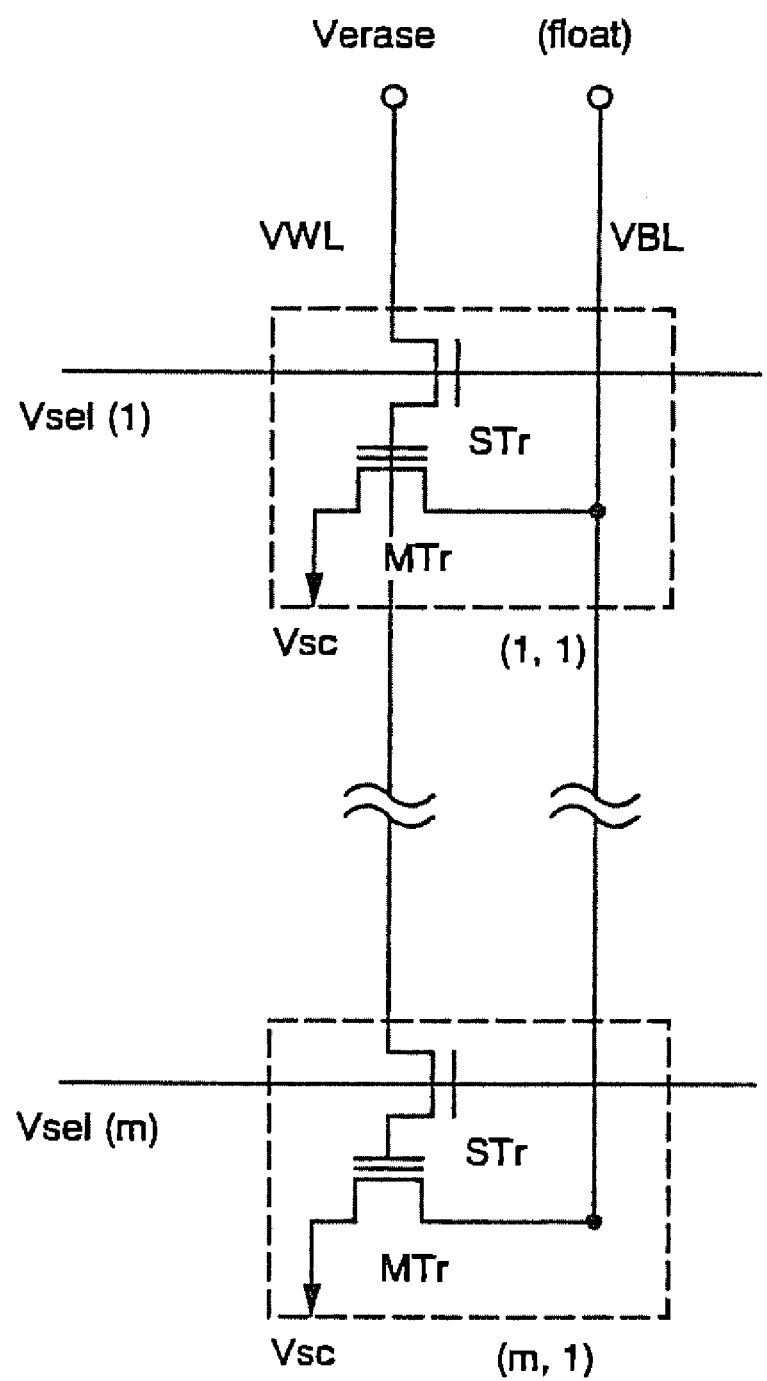
FIG. 22 is a circuit diagram for explaining an erase operation of the non-volatile memory of the present invention.

Finally, an erase operation will be described. At the time of the erase operation, the on signal is inputted as the erase signal Serase, and the off signal is inputted as the write/read signal Sw/r and the readout signal Sread. Besides, the off signal is inputted as the discharge signal Sdc. As a result, a circuit structure concerned with the erase operation to the memory cells (1, 1) to (m, 1) is expressed as shown in FIG. 22. In FIG. 22, reference character VWL designates a potential of the word line; Vsc, a potential of the common source line; and Vsel(1) to Vsel(m), potentials of the selection lines. As shown in FIG. 22, in the erase operation, an operation amplifier and a constant current source do not participate.

The operation voltage at the time of erasing may be made, for example, VWL=−8 V, the potentials Vsel of all the selection lines=0 V, and a substrate potential (or well potential)=8 V. As a result, the selection transistors constituting the first column memory cells are turned on, and a high potential difference of about 16 V is generated between the control gate and the substrate of the memory transistor. As a result, charges stored in the floating gate are drawn into the substrate through the FN tunnel current. Incidentally, the bit line is in the floating state. With respect to the memory cells other than the first column, the control circuits 1804(2) to 1804(n) are in the non-selection state, and the word lines are in the floating state, so that there is no problem of erroneous erasure. Incidentally, instead of making the substrate potential 8 V, it is also possible to provide a partially overlapping region (overlap region) between the source region of the memory transistor and the floating gate to make the common source potential Vsc 8V.

In order to decrease the distribution width after the writing operation in which the verify operation is not carried out, it is naturally necessary that the distribution width of the threshold voltage before the writing is small. However, in the foregoing erase operation, it is generally difficult to realize the narrow distribution width. Then, in this embodiment, after the erase operation through the FN tunnel, verify writing into the erase state is newly carried out. It is preferable that the threshold voltage of the erase state is 0 V or higher, and is made a value slightly higher than that of the distribution after erasure. Incidentally, in the verify writing into the erase state, a well-known circuit structure and a well-known operation method may be used. After the verify writing into the erase state, the potentials of the control gates of all the memory cells are made 0 V by the discharge operation.

In the manner described above, the writing operation, the readout operation, and the erase operation of the non-volatile memory of the present invention are carried out.

In this embodiment, although the two-value non-volatile memory has been described, since the feature of the non-volatile memory of the present invention is in the high accuracy threshold controllability, the effect is rather exhibited in the multi-value non-volatile memory in which the margin of the threshold distribution is small. By combining this embodiment with the embodiment 1, it becomes possible to realize the non-volatile memory in which the writing time is short and the multi-value degree is high.

Incidentally, in this embodiment, although the writing method in which the verify operation is not used has been described, of course, verify writing may be carried out. Besides, in this embodiment, the method of writing and readout to the memory cell (1, 1) and simultaneous erasing of the first column memory cells (1, 1) to (m, 1) have been described, however these operations can be simultaneously carried out over a plurality of columns. The application of these is as described in this embodiment mode.

Incidentally, in this embodiment, although the threshold voltage of the memory transistor in the erase state is made positive, the present invention is not limited to this case. In the case where the threshold voltage of the memory transistor in the erase state is negative, the potential of the control gate is made lower than the threshold voltage of the erase state by the discharge operation, so that an operation can be carried out in exactly the same manner as this embodiment. In addition, it is also effective to make the memory transistor have a split gate structure.

Embodiment 3

The present invention can be applied to various memory elements including a charge storage region between an active region and a control gate electrode. Especially, the present invention can also be applied to a memory element in which a semiconductor cluster layer, a metal cluster layer, or a nitride film is provided as the charge storage region. These memory elements are characterized in that a region for storing an electric charge is spatially discretely provided.

Figure 26A:
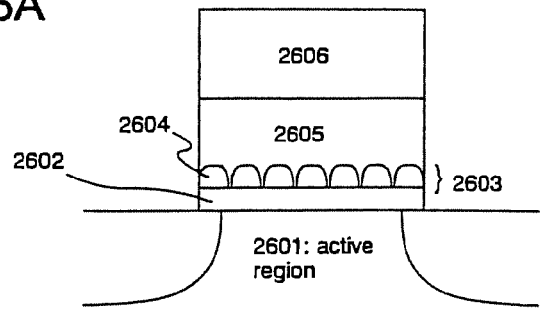
FIGS. 26A to 26D are sectional views of memory elements constituting the non-volatile memory of the present invention.

A memory element using a semiconductor or conductor cluster layer as a region for storing an electric charge is disclosed in, for example, Japanese Patent Publication No. Sho. 49-22356. Its typical sectional structure is shown in FIG. 26A. A memory element shown in FIG. 26A is a memory transistor in which a first insulating film 2602, a cluster layer 2603, a second insulating film 2605, and a control gate electrode 2606 are successively stacked on an active region 2601. The cluster layer 2603 is a layer constituted by discrete block-like semiconductor or conductor (called cluster), and this discrete cluster 2604 functions as a charge-trapped center.

Figure 26B:
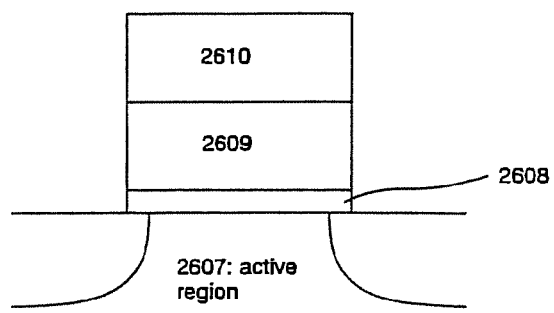
Figure 26C:
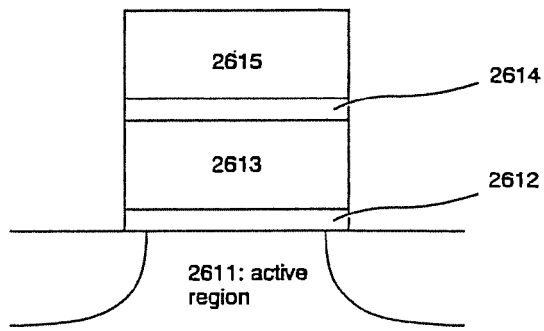

As a memory element using a nitride film as a region for storing an electric charge, MNOS (Metal-Nitride-Oxide-Semiconductor), MONOS (Metal-Oxide-Nitride-Oxide-Semiconductor), and the like are known. Typical sectional structures of the MNOS and the MONOS are shown in FIGS. 26B and 26C, respectively. In the memory element shown in FIG. 26B, an oxide film 2608, a nitride film 2609, and a control gate electrode 2610 are stacked on an active region 2607. In the memory element shown in FIG. 26C, an oxide film 2612, a nitride film 2613, an oxide film 2614, and a control gate electrode 2615 are stacked on an active region 2611. In either case, spatially discrete impurity levels in the nitride film function as charge-trapped centers.

Also in the case where such a memory element is applied to the non-volatile memory of the present invention, the circuit structure and the operation method explained in this embodiment mode can be used as they are. Of course, it is preferable that optimum values are used for the operation voltage and the operation current in each element.

Figure 26D:
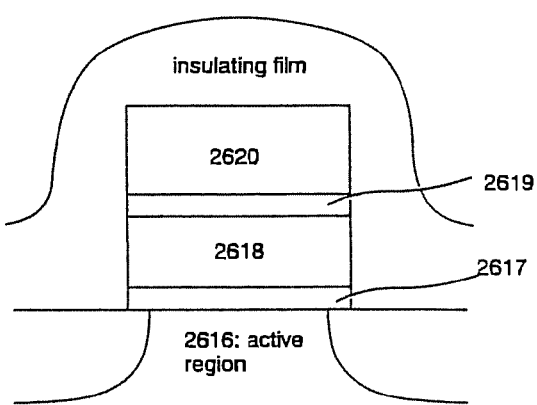

In the case where an element in which a region for storing an electric charge is discretely provided is used as a memory element, there is an effect that a charge holding characteristic is hardly influenced by a defect of a tunnel oxide film or a pin hole. For example, like a memory transistor including a floating gate as shown in FIG. 26D, in the case where a region for storing an electric charge is continuously provided, if one pin hole exists in the tunnel oxide film, since all charges stored in the floating gate leak through the pin hole, it has a large influence on the charge holding characteristic of the memory transistor. However, in the case where an element in which regions for storing electric charges are discretely provided is used, a region receiving the influence of the pin hole is limited, and many charge storage regions do not receive the influence of the pin hole, so that the influence on the charge holding characteristic of the memory element is little.

Incidentally, the memory transistor including the floating gate is a memory transistor in which as shown in FIG. 26D, a first insulating film 2617, a floating gate electrode 2618 made of a semiconductor film or a conductive film, a second insulating film 2619, and a control gate electrode 2620 are successively stacked over an active region 2616.

In the case where the memory element of this embodiment is applied to the non-volatile memory of the present invention, it is preferable to apply it especially to a multi-value memory. Since the multi-value non-volatile memory does not have a large margin of threshold voltages expressing different states, it is well known that high accuracy threshold control at the time of writing or erasing, and an excellent charge holding characteristic become necessary. Since the non-volatile memory of the present invention is excellent in the controllability of threshold voltage, the present invention is especially effective for the multi-value non-volatile memory, as already described in this embodiment mode and the embodiment 1.

On the other hand, with respect to the charge holding characteristic which is another problem of the multi-value non-volatile memory, it becomes possible to make a substantial improvement by using the memory element of this embodiment. Thus, it can be said that the memory element described in this embodiment is especially preferable when the present invention is applied to the multi-value non-volatile memory.

Incidentally, the structure of this embodiment can be freely combined with any structure of the embodiments 1 and 2.

Embodiment 4

In this embodiment, a microprocessor such as an RISC processor and an ASIC processor will be described in which nonvolatile memories of the present invention are integrated on one chip.

Figure 23:
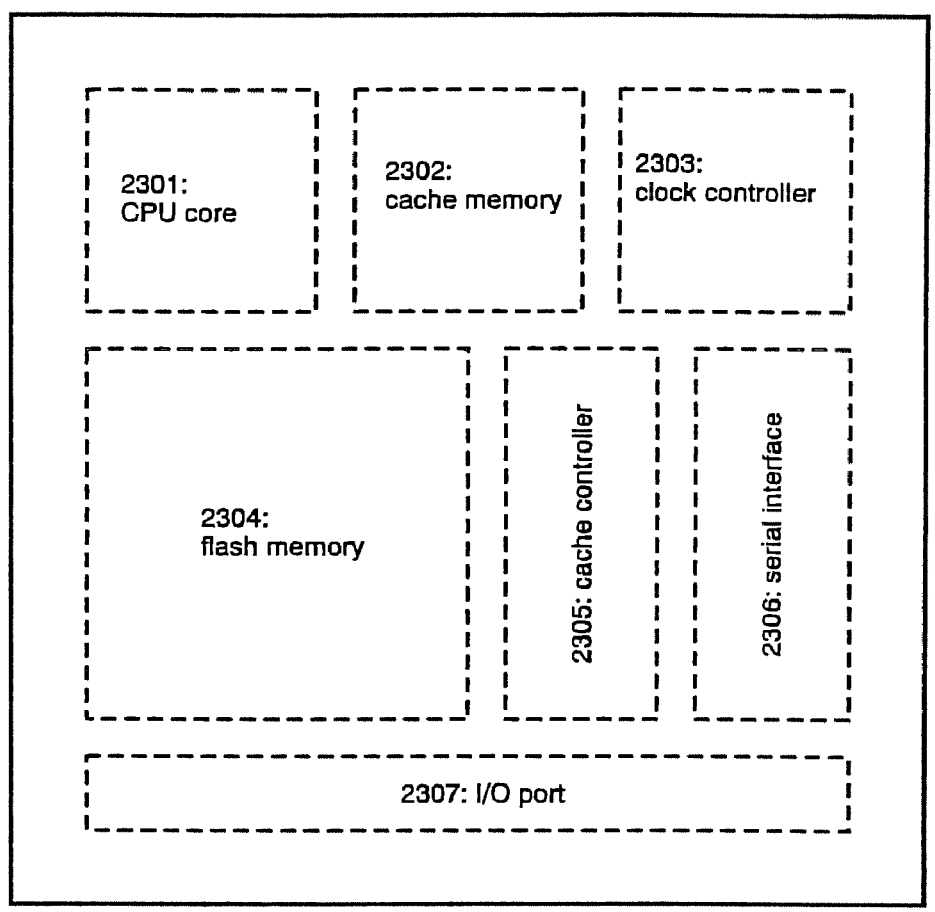
FIG. 23 is a view showing a semiconductor circuit using the non-volatile memory of the present invention.

FIG. 23 shows an exemplary microprocessor. The microprocessor is typically composed of a CPU core 2301, a flash memory 2304 (which may be a RAM), a clock controller 2303, a cache memory 2302, a cache controller 2305, a serial interface 2306, an I/O port 2307, and the like. Needless to say, the microprocessor shown in FIG. 23 is a simplified example, and an actual microprocessor is various designed depending upon its use.

In the microprocessor shown in FIG. 23, the CPU core 2301, the clock controller 2303, the cache controller 2305, the serial interface 2306, and the I/O port 2307 are composed of a CMOS circuit. As the flash memory 2304, the nonvolatile memory of the present invention is used, and a multi-valued flash memory utilizing a pinning memory transistor is used. As the circuit configuration of the flash memory 2304, that shown in Embodiment modes and Embodiments 1 to 3 may be used, or the other circuit configurations may be used. It is also possible to utilize the nonvolatile memory of the present invention for the cache memory 2302.

Further, the microprocessor of this embodiment can be used any structure of combination of Embodiments 1 to 3.

Embodiment 5

The nonvolatile memory of the present invention can be incorporated into electronic equipment in various fields, as a recording medium for storing/reading data. In this embodiment, such electronic equipment will be described.

Examples of the electronic equipment that can utilize the nonvolatile memory of the present invention include a display, a video camera, a digital camera, a head mount display, a DVD player, a game machine, a goggle-type display, a car navigation, an acoustic reproducing apparatus (a car mounted audio, etc.), a personal computer, a portable information terminal (a mobile computer, a mobile phone, an electronic dictionary, etc.), and the like. FIGS. 24A-24F and 25A-25B illustrate examples thereof.

Figure 24A:
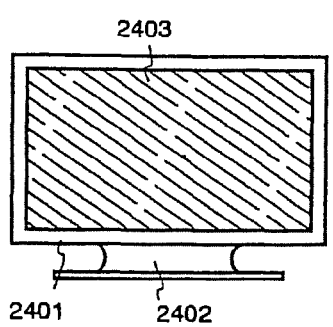
FIGS. 24A to 24F are views showing electronic instruments using the non-volatile memory of the present invention.

FIG. 24A shows a display that includes a housing 2401, a supporter 2402, a display portion 2403, and the like. The present invention is connected to the display portion 2403 and other signal control circuits, and used for correcting an image signal and storing processing data.

Figure 24B:
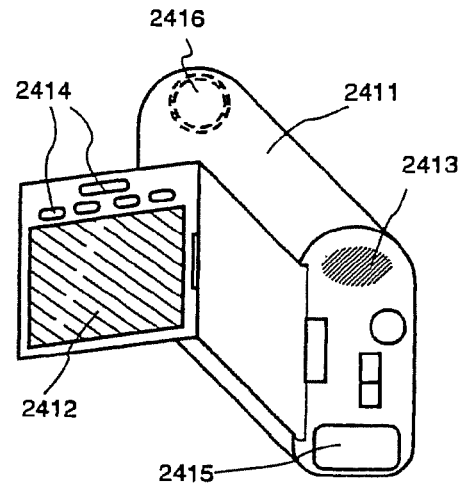

FIG. 24B shows a video camera that is composed of a body 2411, a display portion 2412, a voice input portion 2413, an operation switch 2414, a battery 2415, and an image-receiving portion 2416. The present invention is incorporated into a built-in LSI substrate and used for storing image data and the like.

Figure 24C:
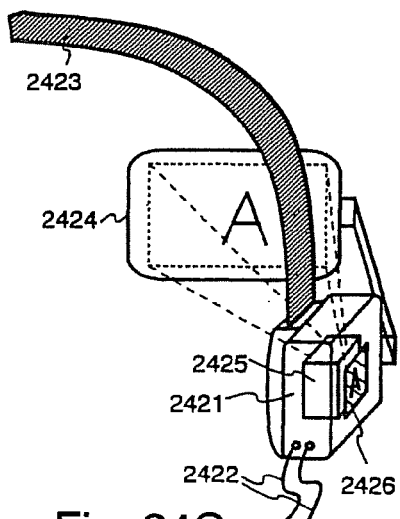

FIG. 24C shows a part (right chip side) of a head mount display including a body 2421, a signal cable 2422, a head portion fixing band 2423, a display portion 2424, an optical system 2425, a display apparatus 2426, and the like. The present invention is connected to the display apparatus 2426 and other signal control circuits, and used for correcting an image signal and storing processing data.

Figure 24D:
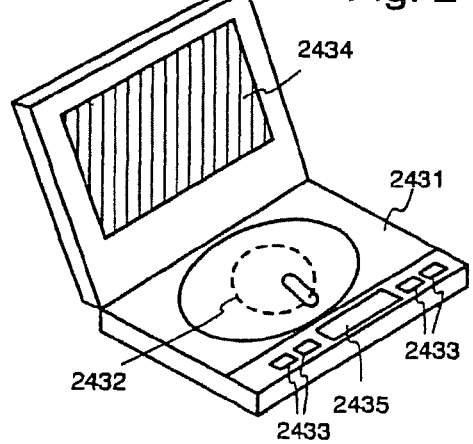

FIG. 24D shows an image reproducing apparatus (more specifically, a DVD reproducing apparatus) provided with a recording medium, which is composed of a body 2431, a recording medium 2432, an operation switch 2433, a display portion (a) 2434, a display portion (b) 2435, and the like. This apparatus uses as a recording medium a digital versatile disc (DVD), a compact disc (CD), and the like so as to allow a user to listen to music, see movies, play games, and browse the Internet. The present invention is incorporated into a built-in LSI substrate and used for storing image data and processing data.

Figure 24E:
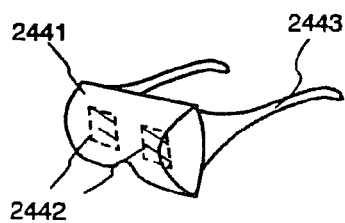

FIG. 24E shows a goggle type display that includes a body 2441, a display portion 2442, and an arm portion 2443. The present invention is connected to the display portion 2442 and other signal control circuits, and used for correcting an image signal and storing processing data.

Figure 24F:
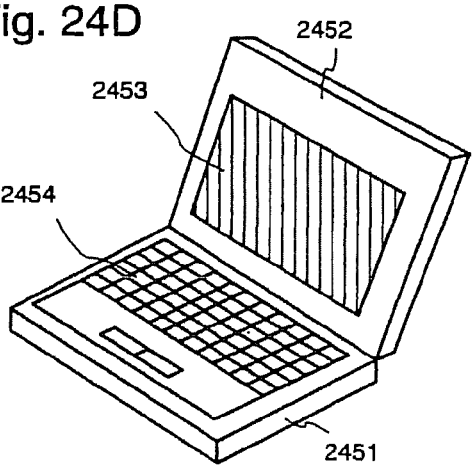

FIG. 24F shows a personal computer that is composed of a body 2451, a housing 2452, a display portion 2453, a keyboard 2454, and the like. The present invention is incorporated into a built-in LSI substrate, and used for storing processing data and image data.

Figure 25A:
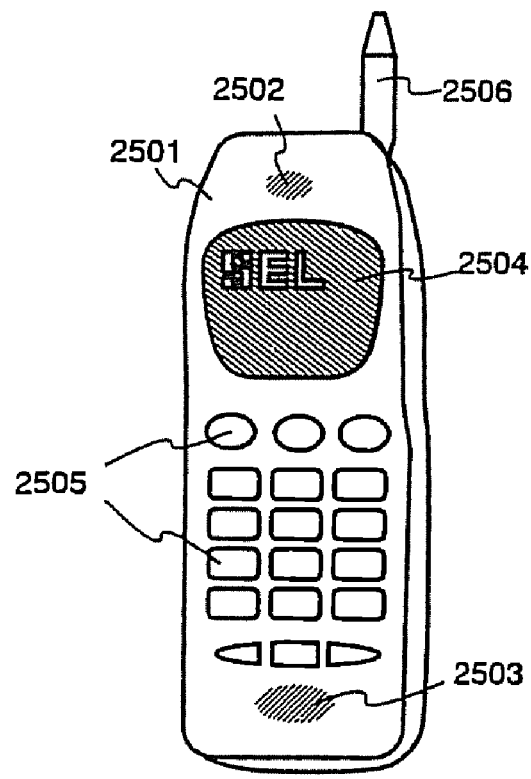
FIGS. 25A and 25B are views showing electronic instruments using the non-volatile memory of the present invention.

FIG. 25A shows a mobile phone that includes a body 2501, a voice output portion 2502, a voice input portion 2503, a display portion 2504, an operation switch 2505, and an antenna 2506. The present invention is incorporated into a built-in LSI substrate, and used for adding an address function of recording telephone numbers.

Figure 25B:
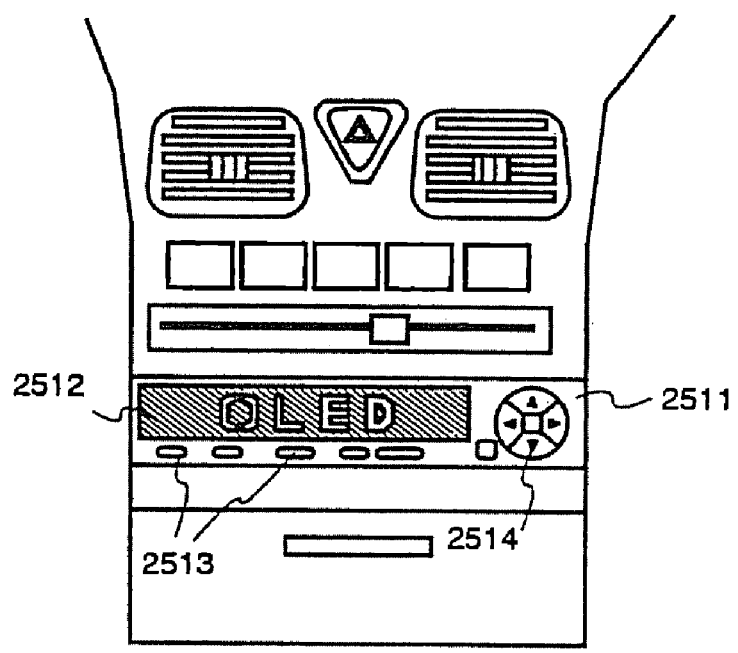

FIG. 25B shows an acoustic reproducing apparatus (more specifically, a car audio system) which includes a body 2511, a display portion 2512, and operation switches 2513 and 2514. The present invention is incorporated into a built-in LSI substrate, and used for storing image data and processing data. Furthermore, in this embodiment, a car mounted audio system is illustrated. However, a portable or domestic acoustic reproducing apparatus may be used.

As described above, the application range of the present invention is very wide, so that the present invention is applicable to electronic equipment in various fields. Furthermore, the electronic equipment of this embodiment can also be realized even by using the configuration formed of any combination of Embodiments 1 to 3.

In the non-volatile memory of the present invention, by controlling a drain voltage and a drain current of a memory element, it becomes possible to carry out high accuracy threshold control in a writing operation.

As a result, it becomes possible to decrease the number of verify times at verify writing, and further, a writing method without using a verify system becomes possible, so that as compared with the prior art, it becomes possible to realize substantial shortening of a writing time.

In the case where the present invention is applied especially to a multi-value non-volatile memory, an effect of shortening of a writing time is large. Further, in the case where a transistor including discrete charge storage regions is used as a memory element, it is possible to provide a multi-value non-volatile memory which is excellent in charge holding characteristic and also in threshold controllability at the time of writing.

By mounting the non-volatile memory of the present invention excellent in the threshold controllability, it is possible to provide a semiconductor device including a non-volatile memory capable of carrying out a high speed writing and erasing operation. As a result, an electronic equipment which incorporates the non-volatile memory of the present invention can shorten a waiting time for data processing. Further, the non-volatile memory of the present invention can be adjusted to high speed CPU.

What is claimed is:
1. A semiconductor device comprising:
   a transistor including a gate electrode which can take a floating state, a source electrode and a drain electrode,
   wherein an amount of charge injection into the gate electrode which can take the floating state is controlled by controlling an amount of current flowing through the transistor and a drain voltage of the transistor.

2. A semiconductor device according to claim 1, wherein the gate electrode which can take the floating state contains a semiconductor film or a conductive film.

3. A semiconductor device according to claim 1, further comprising a control gate electrode over the gate electrode which can take the floating state.

4. A semiconductor device according to claim 3, further comprising a switching transistor in which one of source electrode and a drain electrode thereof is electrically connected to the control gate electrode.

5. A semiconductor device according to claim 1, wherein the transistor stores multi-value data.

6. A semiconductor device according to claim 1, wherein a verify operation is not carried out in a writing operation of the transistor.

7. A semiconductor device according to claim 1, wherein the semiconductor device is incorporated in one selected from the group consisting of a camera, a goggle type display, a DVD player, a computer, a telephone and an audio player.

* * * * *